(12) United States Patent
Sato et al.

(10) Patent No.: US 6,589,705 B1
(45) Date of Patent: Jul. 8, 2003

(54) POSITIVE-WORKING PHOTORESIST COMPOSITION

(75) Inventors: Kenichiro Sato, Shizuoka (JP); Kazuyoshi Mizutani, Shizuoka (JP); Shoichiro Yasunami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/698,190

(22) Filed: Oct. 30, 2000

(30) Foreign Application Priority Data

Oct. 29, 1999 (JP) ............................ 11-309587
Nov. 10, 1999 (JP) ............................ 11-319837

(51) Int. Cl.$^7$ ............................ G03C 1/72; G08F 34/00
(52) U.S. Cl. .............................. 430/270.1; 430/271.1; 430/325; 526/271; 526/279; 526/272
(58) Field of Search .................... 430/270.1, 271.1, 430/325; 526/271, 279, 272

(56) References Cited

U.S. PATENT DOCUMENTS

| | | | |
|---|---|---|---|
| 5,346,803 A | | 9/1994 | Crivello et al. |
| 5,360,693 A | * | 11/1994 | Sebald et al. ............... 430/192 |
| 5,942,367 A | * | 8/1999 | Watanabe et al. ........... 430/170 |
| 6,063,543 A | * | 5/2000 | Hien et al. ............... 430/270.1 |
| 6,165,682 A | * | 12/2000 | Foster et al. ............. 430/270.1 |
| 6,306,990 B1 | * | 10/2001 | Hien et al. .................. 526/272 |
| 2002/0028409 A1 | * | 3/2002 | Yasunami et al. ........ 430/272.1 |

FOREIGN PATENT DOCUMENTS

| | | |
|---|---|---|
| EP | 0 919 867 A2 | 6/1999 |
| EP | 0 952 489 A1 | 10/1999 |
| WO | WO 99/42903 | 8/1999 |

OTHER PUBLICATIONS

XP–002158327, J.V. Crivello et al., Deep UV Photoresists Based on Poly(DI–Tert–Butyl Fumarate), vol. 33, No. 3, pp. 513–523 (1995).
European Search Report.
P. Zandbergen et al., *Proximity Bias Swing: Origin and Characterization*, Proc. SPIE, vol. 3333, p. 837–844 (Jun. 1998).
M. Reilly et al., *Comparison of OPC Rules and Common Process Windows for 130 nm Features Using Binary and Attenuated Phase Shift Mask*, Proc. SPIE vol. 4000, p. 1209–1222 (Jul. 2000).

* cited by examiner

Primary Examiner—Rosemary Ashton
Assistant Examiner—Yvette C. Thornton
(74) Attorney, Agent, or Firm—Sughrue Mion, PLLC

(57) ABSTRACT

A positive-working photoresist composition comprises (A) a resin comprising the specific repeating structural units which resin increases in its solubility in an alkaline developer when acted upon by an acid, (B') an onium salt compound which generates an acid when irradiated with active ray or radiation and (C) at least one of fluorine-based and/or silicon-based surface active agent and nonionic surface active agent or a positive-working photoresist composition comprises (A) a resin comprising the specific repeating structural units which resin increases in its solubility in an alkaline developer when acted upon by an acid, (B) a compound which generates an acid when irradiated with active ray or radiation, and (D) a mixed solvent containing at least one propylene glycol monoalkyl ether carboxylate and at least one of solvents selected from the group consisting of propylene glycol monoalkyl ether, alkyl lactate and alkoxyalkyl propionate and solvents selected from the group consisting of γ-butyrolactone, ethylene carbonate and propylene carbonate.

10 Claims, No Drawings

POSITIVE-WORKING PHOTORESIST COMPOSITION

FIELD OF THE INVENTION

The present invention relates to a positive-working photoresist composition for use in the production of semiconductor integrated circuit element, mask for the production of integrated circuit, printed-wiring board, liquid crystal panel, etc.

BACKGROUND OF THE INVENTION

As a method for the formation of a pattern in the production of electronic components such as semiconductor device, magnetic bubble memory and integrated circuit there has heretofore widely been practically used a method involving the use of a photoresist sensitive to ultraviolet or visible ray. These photoresists can be divided into two groups, i.e., negative-working photoresist which is rendered insoluble in a developer when irradiated with light and positive-working photoresist which is rendered soluble in a developer when irradiated with light. The negative-working photoresist exhibits a higher sensitivity and better adhesivity to the substrate and chemical resistance required to wet etching than the positive-working photoresist and thus has been mainly used so far.

However, with the enhancement of the density and the degree of integration of semiconductor device, etc., the width and distance between lines on pattern have been extremely reduced. Further, as a method for etching a substrate there has been recently employed dry etching method. Thus, the photoresist has been desired to have a high resolution and a high dry etching resistance. Therefore, positive-working photoresists have been mainly used recently.

Further, as the electronic apparatus has recently been rendered more multi-functional and advanced, it has been keenly desired to provide finer patterns for higher density and integration.

In other words, since the integrated circuit can be reduced less in its vertical dimension than in its horizontal dimension, it has been natural that the ratio of height to width of a resist pattern should be great. Accordingly, it is more difficult to depress the dimensional change of a resist pattern on a wafer having a complicated step structure as the pattern becomes finer.

Further, various exposure methods are facing problems accompanying the reduction of the smallest dimension. For example, the exposure to light has been liable to interference of reflected light due to the step structure of a substrate that greatly affects the dimensional accuracy of the resist pattern. On the other hand, the exposure to electron beam has been liable to back scattering of electrons causing a proximity effect that makes it impossible to increase the ratio of height to width of a fine resist pattern.

It has been found that the foregoing many problems can be eliminated by the use of a multi-layer resist system. For the outline of such a multi-layer resist system, reference can be made to Solid State Technology, 74 (1981). Many studies of this system have been further reported.

In general, multi-layer resist methods can be divided into two groups, i.e., three-layer resist method and two-layer resist method. The three-layer resist method comprises applying an organic flat layer to a stepped substrate, superposing an inorganic interlayer and a resist on the organic flat layer, patterning the resist, dry-etching the inorganic interlayer with the resist as a mask, and then subjecting the organic flat layer to O2RIE (reactive ion etching) with the inorganic interlayer as a mask to form a pattern. This method can be basically accomplished by conventional techniques and thus has long been studied. However, since this method involves the lamination of three layers having different physical properties, i.e., organic layer, inorganic layer and organic layer, it is disadvantageous in that the interlayer is apt to have cracks or pin-holes.

As opposed to the three-layer resist method, the two-layer resist method involves the use of a resist which acts as resist in the three-layer resist method as well as an inorganic interlayer, i.e., a resist having oxygen plasma resistance. In accordance with the two-layer resist method, the occurrence of cracks or pin-holes can be inhibited. Further, since the number of resist layers to be worked is reduced from 3 to 2, the required procedure can be simplified. However, while the three-layer resist method allows the use of a conventional resist as the upper resist, the two-layer resist method faces a problem that a resist having oxygen plasma resistance must be newly developed.

Under these circumstances, it has been desired to develop a high sensitivity and high resolution positive-working photoresist having an excellent oxygen plasma resistance which can be used as the upper layer resist for two-layer resist method, etc., particularly an alkali development process resist which can be used without changing the existing process.

In the production of VLSI (very large scale integration) requiring the working of ultrafine pattern comprising lines having a width of half micron or less, the wavelength of light from the exposure apparatus for use in lithography has been reduced more and more. The use of KrF excimer laser beam and ArF excimer laser beam has been recently considered. Such a short wavelength photolithography usually employs a so-called chemically-amplified resist.

In the case where ArF excimer laser beam is utilized in particular, it is not appropriate from the standpoint of optical transparency of film to introduce a phenol structure into the binder resin which is a main component of the resist. It is instead usual to use as a binder a resin polymer containing as an image-forming site a structure which decomposes with an acid to produce a carboxylic acid such as tertiary ester (e.g., t-butylester), 1-alkyladamantylester and THP-protected carboxylic acid.

As an example of Si-containing resist containing an image-forming site transparent to ArF excimer laser beam there is disclosed a terpolymer comprising maleic anhydride, unsaturated carboxylic acid t-butylester and allyl trimethylsilane in JP-A-5-11450 (The term "JP-A" as used herein means an "unexamined published Japanese patent application"). This resist is excellent in the resolution for the working of ultrafine pattern but leaves something to be desired in sensitivity. Further, this resist is disadvantageous in that it exhibits a deteriorated compatibility with a photo-acid generator during the preparation of a resist solution, causing turbidity. This resist is also disadvantageous in that it undergoes precipitation of insoluble matters with time. Eventually, this resist leaves something to be desired in age stability. This resist further leaves something to be desired dependence on density (defocus latitude depended on line pitch). Since the recent devices tend to have various patterns, resists having various properties have been desired. One of these requirements is dependence on density. Devices use a pattern comprising a portion having lines densely distributed, a portion having spaces wider than lines and a lone line. Thus, it is important to resolve these lines with a high reproducibility. However, it is not necessarily easy to reproduce various lines due to optical factors. Accordingly, the method for resolving these problems by resist is not definite. In particular, the resist system containing the foregoing resin has a remarkable difference in properties between lone pattern and dense pattern and thus leaves something to be desired.

Further, this resist is excellent in the resolution for the working of ultrafine pattern but is liable to the occurrence of roughness on resist pattern. The term "edge roughness" as used herein is meant to indicate that the pattern is observed uneven at the edge as viewed from above because the top and bottom edges of the line pattern of the resist are arranged irregularly along the line and in the vertical direction due to the characteristics of the resist.

Further, this resist is disadvantageous in that it exhibits a deteriorated compatibility with a photo-acid generator during the preparation of a resist solution, causing turbidity. This resist is also disadvantageous in that it undergoes precipitation of insoluble matters with time. Eventually, this resist leaves something to be desired in age stability.

SUMMARY OF THE INVENTION

It is an object of the invention to provide a positive-working photoresist composition which exhibits a high sensitivity in the production of semiconductor device.

It is another object of the invention to provide a positive-working photoresist composition which gives less edge roughness on resist pattern in the production of semiconductor device.

It is a further object of the invention to provide a positive-working photoresist composition which causes no precipitation of undissolved matters during the preparation or aging storage of resist solution.

It is a still further object of the invention to provide a positive-working photoresist composition excellent in dependence on density.

It is a still further object of the invention to provide a positive-working photoresist composition which is less liable to variation of sensitivity after aging storage.

The inventors made extensive studies of positive-working chemically-sensitized photoresist composition. As a result, it was found that the objects of the invention can be accomplished by the use of an acid-decomposable resin obtained by the copolymerization of specific repeating structural units, a specific photo-acid generator and a specific surface active agent.

The inventors also found that the objects of the invention can also be accomplished by the use of an acid-decomposable resin obtained by the copolymerization of specific repeating structural units and a specific mixed solvent.

In other words, the present invention provides the following positive-working photoresist compositions.

(1) A positive-working photoresist composition comprising (A) a resin comprising a repeating structural unit represented by the following general formula (I) and a repeating structural unit represented by at least one of the following general formulae (IIa) and (IIb) which resin increases in its solubility in an alkaline developer when acted upon by an acid, (B') an onium salt compound which generates an acid when irradiated with active ray or radiation and (C) at least one of fluorine-based and/or silicon-based surface active agent and nonionic surface active agent:

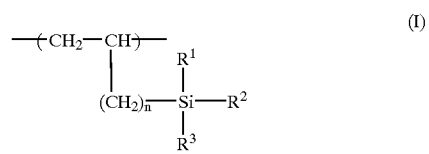

wherein $R^1$ to $R^3$ each independently represents an alkyl group, haloalkyl group, halogen atom, alkoxy group, trialkylsilyl group or trialkylsilyloxy group; and n represents an integer of 0 or 1;

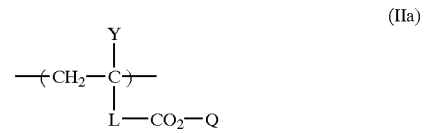

wherein Y represents a group selected from the group consisting of hydrogen atom, methyl group, cyano group and chlorine atom; L represents a single bond or divalent connecting group; and Q represents a tertiary alkyl group having 5 to 20 carbon atoms, alkoxymethyl group, alkoxyethyl group or isobornyl group;

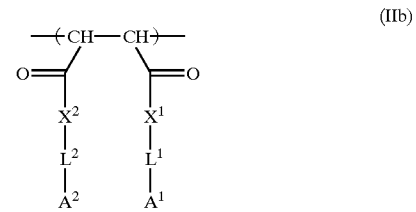

wherein $X^1$ and $X^2$ each independently represents a group selected from the group consisting of oxygen atom, sulfur atom, —NH— and —NHSO$_2$—; $L_1$ and $L_2$ each independently represents a single bond or divalent connecting group; $A^1$ represents —Q or —COOQ, with the proviso that when $X^1$ is an oxygen atom and $L^1$ is a single bond, $A^1$ represents —Q; $A^2$ represents a hydrogen atom, cyano group, hydroxyl group, —COOH, —COOR', —CO—NH—R", alkyl group which may be substituted, cyclic hydrocarbon group which may be substituted, alkoxy group, —Q or —COOQ in which R' and R" each independently represents an alkyl group which may have a substituent; and Q represents a tertiary alkyl group having 5 to 20 carbon atoms, alkoxymethyl group, alkoxyethyl group or isobornyl group.

(2) The positive-working photoresist composition according to Clause (1), wherein the resin (A) contains a repeating structural unit represented by the following general formula (III):

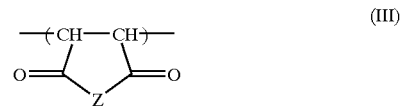

wherein Z represents an oxygen atom or N—$R^3$ in which $R^3$ represents a hydrogen atom, hydroxyl group, straight-chain or branched alkyl group or —O—SO$_2$—$R^4$ in which $R^4$ represents an alkyl group or trihalomethyl group.

(3) The positive-working photoresist composition according to Clause (1), wherein the onium salt compound (B') is a compound represented by the following general formula [sI] or [sII] which generates an acid when irradiated with active ray or radiation:

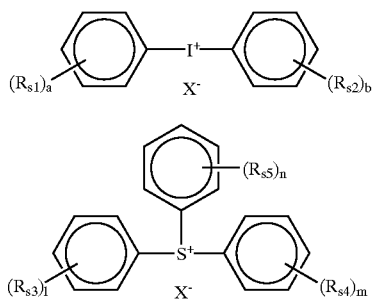

wherein Rs1 to Rs5 each independently represents a hydrogen atom, alkyl group which may have a substituent, cycloalkyl group which may have a substituent, alkoxy group which may have a substituent, alkoxycarbonyl group which may have a substituent, acyl group which may have a substituent, acyloxy group which may have a substituent, nitro group, halogen atom, hydroxyl group or carboxyl group; a, b and l each independently represents an integer of from 1 to 5; m and n each independently represents an integer of from 0 to 5; when plural groups corresponding to Rs1, Rs2, Rs3, Rs4 or Rs5 are present, these groups may be the same or different, with the proviso that in formula [sI] at least one of the groups represented by $Rs_1$ and $Rs_2$ represents an alkyl, cycloalkyl, alkoxy, alkoxycarbonyl, acyl or acyloxy group having 5 or more carbon atoms which may have a substituent and that in formula [sII] when the sum of l, m and n is 1, $Rs_3$ represents an alkyl, cycloalkyl, alkoxy, alkoxycarbonyl, acyl or acyloxy group which may have a substituent; and X represents R—$SO_3$ in which R represents an aliphatic or aromatic hydrocarbon group which may have a substituent.

(4) The positive-working photoresist composition according to Clause (3), wherein R represents a fluorinated aliphatic hydrocarbon group or fluorinated aromatic hydrocarbon group.

(5) The positive-working photoresist composition according to Clause (3), wherein R represents nonafluorobutyl group.

(6) The positive-working photoresist composition according to any one of Clauses (1) to (5), further comprising an organic basic compound.

(7) A positive-working photoresist composition comprising (A) a resin comprising a repeating structural unit represented by the following general formula (I) and a repeating structural unit represented by at least one of the following general formulae (IIa) and (IIb) which resin increases in its solubility in an alkaline developer when acted upon by an acid, (B) a compound which generates an acid when irradiated with active ray or radiation, and (D) a mixed solvent containing at least one of solvents belonging to the group a and at least one of solvents belonging to the group b and solvents belonging to the group c:

Group a: propylene glycol monoalkyl ether carboxylate;
Group b: propylene glycol monoalkyl ether, alkyl lactate, alkoxyalkyl propionate; and
Group c: γ-Butyrolactone, ethylene carbonate, Propylene carbonate

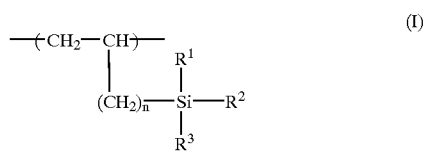

wherein $R^1$ to $R^3$ each independently represents an alkyl group, haloalkyl group, halogen atom, alkoxy group, trialkylsilyl group or trialkylsilyloxy group; and n represents an integer of 0 or 1;

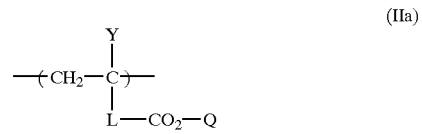

wherein Y represents a group selected from the group consisting of hydrogen atom, methyl group, cyano group and chlorine atom; L represents a single bond or divalent connecting group; and Q represents a tertiary alkyl group having 5 to 20 carbon atoms, alkoxymethyl group, alkoxyethyl group or isobornyl group;

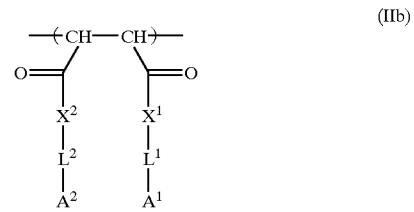

wherein $X^1$ and $X^2$ each independently represents a group selected from the group consisting of oxygen atom, sulfur atom, —NH— and —$NHSO_2$—; $L^1$ and $L^2$ each independently represents a single bond or divalent connecting group; $A^1$ represents —Q or —COOQ, with the proviso that when $X^1$ is an oxygen atom and $L^1$ is a single bond, $A^1$ represents —Q; $A^2$ represents a hydrogen atom, cyano group, hydroxyl group, —COOH, —COOR', —CO—NH—R", alkyl group which may be substituted, cyclic hydrocarbon group which may be substituted, alkoxy group, —Q or —COOQ in which R' and R" each independently represents an alkyl group which may have a substituent; and Q represents a tertiary alkyl group having 5 to 20 carbon atoms, alkoxymethyl group, alkoxyethyl group or isobornyl group.

(8) The positive-working photoresist composition according to Clause (7), wherein the resin (A) further comprises a repeating structural unit represented by the following general formula (III):

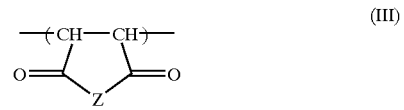

wherein Z represents an oxygen atom or N—$R^3$ in which $R^3$ represents a hydrogen atom, hydroxyl group, straight-chain or branched alkyl group or —O—$SO_2$—$R^4$ in which $R^4$ represents an alkyl or trihalomethyl group.

(9) The positive-working photoresist composition according to Clause (7) or (8), further comprising at least one of fluorine-based and/or silicon-based surface active agents.

(10) The positive-working photoresist composition according to any one of Clauses (7) to (9), further comprising an organic basic compound.

DETAILED DESCRIPTION OF THE INVENTION

The compounds to be used in the invention will be further described hereinafter.

The resin (A) of the invention will be further described hereinafter.

The resin (A) is a resin comprising a repeating structural unit represented by the foregoing general formula (I) and a repeating structural unit represented by at least one of the foregoing general formulae (IIa) and (IIb). Preferably, the resin (A) further contains a repeating structural unit represented by the foregoing general formula (III). The incorporation of the repeating structural unit represented by the foregoing general formula (III) provides further improvement of dependence on density.

In the repeating structural unit (I), $R^1$ to $R^3$ each independently represents a group selected from the group consisting of alkyl group, haloalkyl group, halogen atom, alkoxy group, trialkylsilyl group and trialkylsilyloxy group.

A preferred example of the foregoing alkyl group is a $C_{1-10}$ straight-chain or branched alkyl group. Preferred among these alkyl groups is a $C_{1-6}$ straight-chain or branched alkyl group. Particularly preferred among these alkyl groups are methyl group, ethyl group, n-propyl group, i-propyl group, n-butyl group, i-butyl group, s-butyl group, and t-butyl group.

Examples of the haloalkyl group include chloromethyl group, bromomethyl group, and iodomethyl group.

A preferred example of the foregoing alkoxy group is a $C_{1-6}$ straight-chain or branched alkoxy group. Preferred among these alkoxy groups are methoxy group, ethoxy group, n-propyloxy group, i-propyloxy group, n-butoxy group, i-butoxy group, s-butoxy group, and t-butoxy group. Particularly preferred among these alkoxy groups are methoxy group and ethoxy group.

A preferred example of the alkyl moiety in the trialkylsilyl group is a $C_{1-6}$ straight-chain or branched alkyl group. Preferred among these alkyl groups are methyl group, ethyl group, n-propyl group, i-propyl group, n-butyl group, i-butyl group, s-butyl group, and t-butyl group. Particularly preferred among these alkyl groups is methyl group.

A preferred example of the alkyl moiety in the trialkylsilyloxy group is a $C_{1-6}$ straight-chain or branched alkyl group. Preferred among these alkyl groups are methyl group, ethyl group, n-propyl group, i-propyl group, n-butyl group, i-butyl group, s-butyl group, and t-butyl group. Particularly preferred among these alkyl groups is methyl group.

The suffix n represents an integer of 0 or 1, preferably 1. In this arrangement, the edge roughness on line can be improved.

Specific examples of the repeating unit represented by the foregoing general formula (I) will be given below, but the present invention should not be construed as being limited thereto.

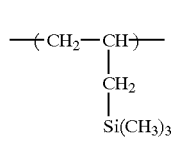
(I-1)

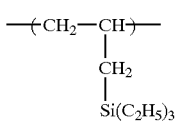
(I-2)

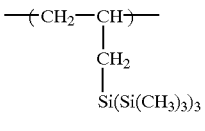
(I-3)

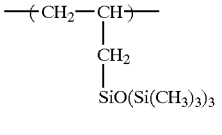
(I-4)

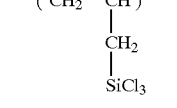
(I-5)

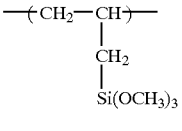
(I-6)

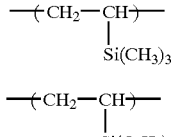
(I-7)

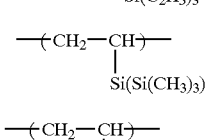
(I-8)

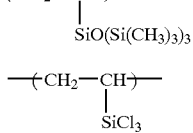
(I-9)

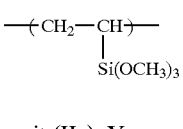
(I-10)

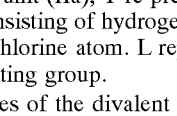
(I-11)

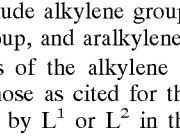
(I-12)

In the repeating unit (IIa), Y represents a group selected from the group consisting of hydrogen atom, methyl group, cyano group and chlorine atom. L represents a single bond or divalent connecting group.

Specific examples of the divalent connecting group represented by L include alkylene group, substituted alkylene group, arylene group, and aralkylene group.

As to examples of the alkylene group and substituted alkylene group, those as cited for the divalent connecting group represented by $L^1$ or $L^2$ in the repeating unit (IIb) shown below can also be cited herein. As the arylene group, those having from 6 to 14 carbon atoms are preferred, and examples of the arylene group include o-phenylene group, m-phenylene group, p-phenylene group, naphthylene group, and anthrylene group. As the aralkylene group, those having 7 to 15 carbon atoms are preferred, and examples of the aralkylene group include phenylmethylene group and phenylethylene group.

Q represents a tertiary alkyl group having 5 to 20 carbon atoms, an alkoxymethyl group (preferably having 2 to 11 carbon atoms), an alkoxyethyl group (preferably having 3 to 12 carbon atoms), or an isobornyl group. Specific examples of the group represented by Q include t-amyl group, 1-methylcyclohexyl group, isobornyl group, 1-ethoxyethyl group, 1-butoxyethyl group, 1-isobutoxyethyl group, 1-cyclohexyloxyethyl group, 1-methoxymethyl group, 1-ethoxymetyl group, 2-methyl-adamantyl group, and 2-ethyl-adamantyl group.

As the tertiary alkyl group having 5 to 20 carbon atoms represented by Q, the group represented by the following general formula (pI) or (pII) is preferred:

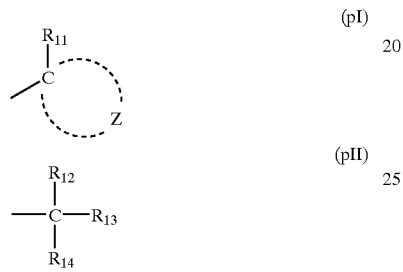

wherein in the general formula (pI), $R_{11}$ represents a methyl group, ethyl group, n-propyl group, isopropyl group, n-butyl group, isobutyl group or sec-butyl group, and Z represents an atomic group required to form an alicyclic hydrocarbon group with a carbon atom, and in the general formula (pII), $R_{12}$ to $R_{14}$ each independently represents a $C_{1-4}$ straight-chain or branched alkyl group or an alicyclic hydrocarbon group.

Examples of the alkyl group include methyl group, ethyl group, n-propyl group, isopropyl group, n-butyl group, isobutyl group, sec-butyl group, and t-butyl group.

Examples of further substituents on the alkyl group include $C_{1-4}$ alkoxyl group, halogen atom (e.g., fluorine, chlorine, bromine, iodine), acyl group, acyloxy group, cyano group, hydroxyl group, carboxyl group, alkoxycarbonyl group, and nitro group.

The alicyclic hydrocarbon group represented by $R_{12}$ to $R_{14}$ or the alicyclic hydrocarbon group formed by Z and the carbon atom may be monocyclic or polycyclic. Specific examples of such an alicyclic hydrocarbon group include groups having monocyclo, bicyclo, tricyclo or tetracyclo structure having 5 or more carbon atoms. The alicyclic hydrocarbon group preferably has from 6 to 30 carbon atoms, particularly from 7 to 25 carbon atoms. These alicyclic hydrocarbon groups may have a substituent.

Examples of the structure of alicyclic moiety of alicyclic hydrocarbon group will be given below.

 (1)

 (2)

-continued

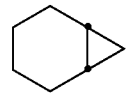 (3)

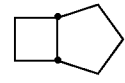 (4)

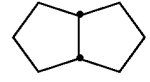 (5)

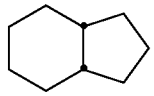 (6)

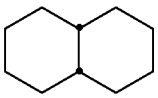 (7)

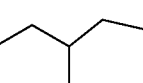 (8)

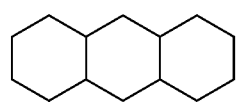 (9)

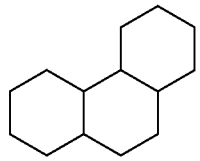 (10)

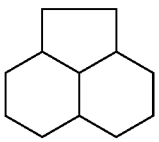 (11)

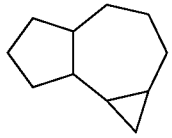 (12)

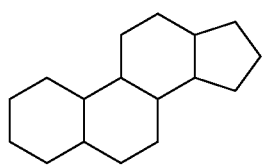 (13)

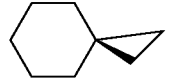 (16)

 (17)

-continued
(18)
(19)
(20)
(21)
(22)
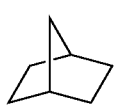
(23)
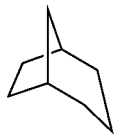
(24)
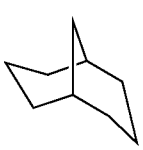
(25)
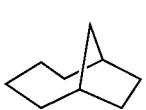
(26)
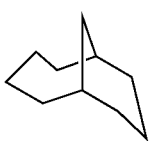
(27)
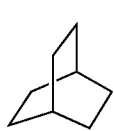
(28)
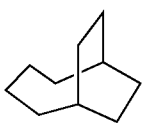
(29)
-continued
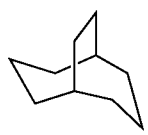
(30)
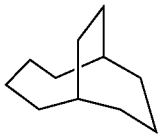
(31)
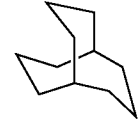
(32)
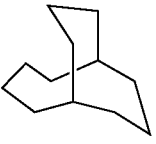
(33)
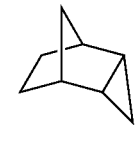
(34)
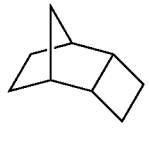
(35)
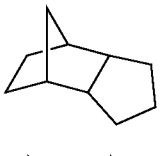
(36)
(37)
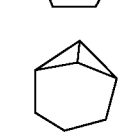
(38)
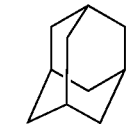
(39)
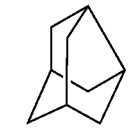
(40)
(41)

-continued

(42) 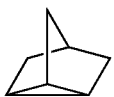

(43) 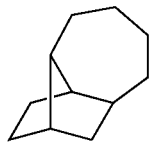

(44) 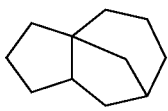

(45) 

(46) 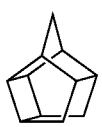

(47) 

(48) 

(49) 

(50) 

Preferred examples of the alicyclic moiety of the invention include adamantyl group, noradamnatyl group, decalin residue, tricyclodecanyl group, tetracyclododecanyl group, norbornyl group, cedrol group, cyclohexyl group, cycloheptyl group, cyclooctyl group, cyclodecanyl group, and cyclododecanyl group. Even more desirable among these groups are adamantyl group, decalin residue, norbornyl group, cedrol group, cyclohexyl group, cycloheptyl group, cyclooctyl group, cyclodecanyl group, and cyclododecanyl group.

Examples of substituents on these alicyclic hydrocarbon groups include alkyl group, substituted alkyl group, halogen atom, hydroxyl group, alkoxyl group, carboxyl group, and alkoxycarbonyl group. Preferred examples of the alkyl group include lower alkyl groups such as methyl group, ethyl group, propyl group, isopropyl group and butyl group. Even more desirable among these alkyl groups are methyl group, ethyl group, propyl group, and isopropyl group. Examples of substituents on the substituted alkyl group include hydroxyl group, halogen atom, and alkoxy group. Examples of the alkoxy group include $C_{1-4}$ alkoxy group such as methoxy, ethoxy, propoxy and butoxy.

In the repeating unit (IIb), $X^1$ and $X^2$ each independently represents a group selected from the group consisting of oxygen atom, sulfur atom, —NH— and —NHSO$_2$—. $L^1$ and $L^2$ each independently represents a single bond or divalent connecting group.

Specific examples of the divalent connecting group represented by $L^1$ or $L^2$ include alkylene group, substituted alkylene group, ether group, thioether group, carbonyl group, ester group, amide group, sulfonamide group, urethane group, and urea group. These divalent connecting groups may be used singly or in combination of two or more thereof.

Examples of the alkylene group or substituted alkylene group represented by $L^1$ or $L^2$ include those represented by the following general formula:

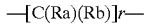

—[C(Ra)(Rb)]$_r$—

In the foregoing general formula, Ra and Rb may be the same or different and each represents a hydrogen atom, alkyl group, substituted alkyl group, halogen atom, hydroxyl group or alkoxy group. Preferred examples of the alkyl group include lower alkyl group such as methyl group, ethyl group, propyl group, isopropyl group and butyl group. Particularly preferred among these alkyl groups are methyl group, ethyl group, propyl group, and isopropyl group. Examples of the substituents on the substituted alkyl group include hydroxyl group, halogen atom, and alkoxy group. Examples of the alkoxy group include $C_{1-4}$ alkoxy group such as methoxy group, ethoxy group, propoxy group and butoxy group. Examples of the halogen atom include chlorine atom, bromine atom, fluorine atom, and iodine atom. The suffix r represents an integer of from 1 to 10.

$A^2$ represents a hydrogen atom, cyano group, hydroxyl group, —COOH, —COOR', —CO—NH—R", alkyl or alkoxy group which may be substituted, —Q or —COOQ in which R' and R" each independently represents an alkyl group which may have a substituents.

A preferred example of the alkyl group represented by $A^2$, R' or R" is a $C_{1-10}$ straight-chain or branched alkyl group. Preferred among these alkyl groups is a $C_{1-6}$ straight-chain or branched alkyl group. Particularly preferred among these alkyl groups are methyl group, ethyl group, n-propyl group, i-propyl group, n-butyl group, i-butyl group, and s-butyl group. A preferred example of the alkoxy group represented by $A^2$, R' or R" is a $C_{1-6}$ straight-chain or branched alkoxy group. Preferred among these alkoxy groups are methoxy group, ethoxy group, n-propyloxy group, i-propyloxy group, n-butoxy group, i-butoxy group, s-butoxy group, and t-butoxy group. Particularly preferred among these alkoxy groups are methoxy group and ethoxy group. Examples of Q represented by $A^2$, R' or R" include those described with reference to the repeating unit (IIa).

Examples of further substituents on the foregoing alkyl group and alkoxy group include halogen atom such as fluorine, chlorine, bromine and iodine, and alkoxy group such as methoxy, ethoxy, propoxy and butoxy.

Examples of the cyclic hydrocarbon group represented by $A^2$ include cyclopropyl group, cyclopentyl group, cyclohexyl group, adamanthyl group, 2-methyl-2-adamanthyl group, norbornyl group, boronyl group, isoboronyl group, tricyclodecanyl group, dicyclopentenyl group, norbornane epoxy group, menthyl group, isomenthyl group, neomenthyl group, and tetracyclododecanyl group. Examples of the bonds forming these cyclic hydrocarbon rings include ester bond and carbonyl group.

Examples of further substituents on the cyclic hydrocarbon group include hydroxyl group, halogen atom, carboxyl group, alkoxy group, acyl group, cyano group, and acyloxy group. Examples of the halogen atom include chlorine atom, bromine atom, fluorine atom, and iodine atom. Examples of the alkoxy group include a $C_{1-4}$ alkoxy group such as methoxy group, ethoxy group, propoxy group and butoxy group. Examples of the acyl group include formyl group and acetyl group. Examples of the acyloxy group include acetoxy group.

Specific examples of the repeating unit represented by the foregoing general formula (IIa) will be given below, but the present invention should not be construed as being limited thereto.

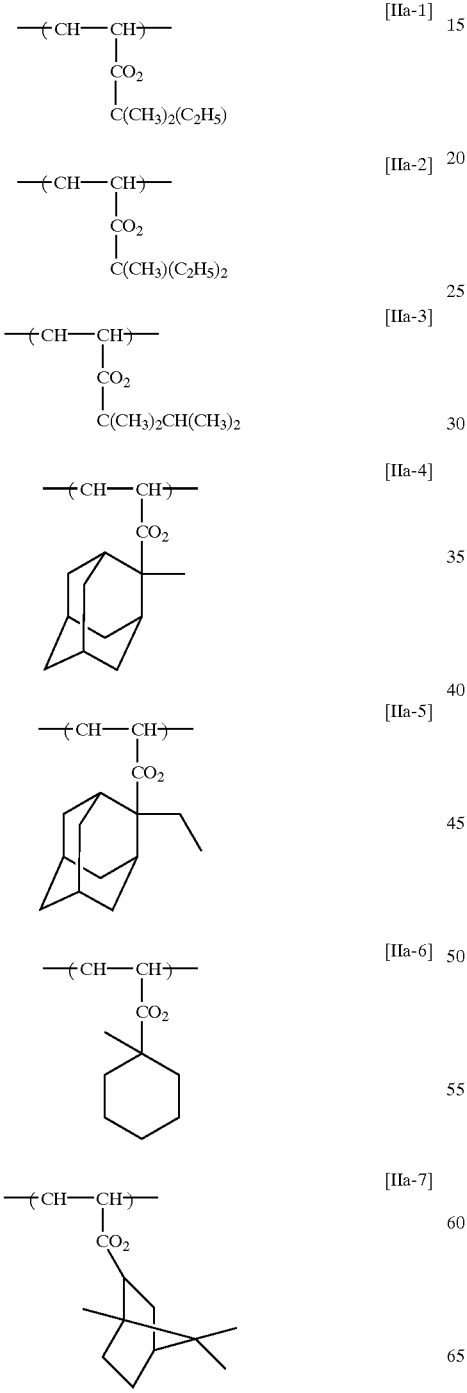

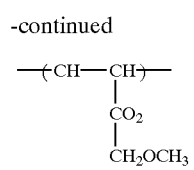
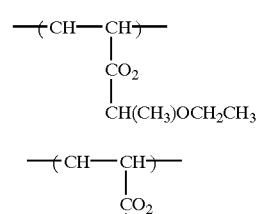
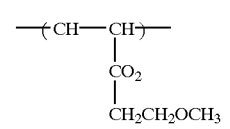
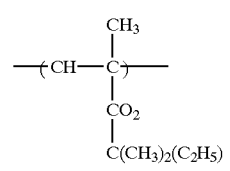
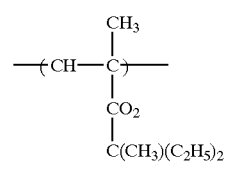
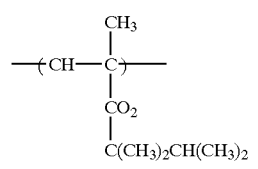
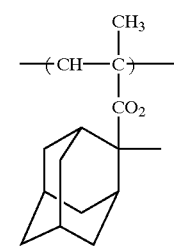
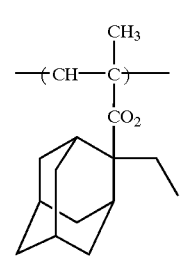
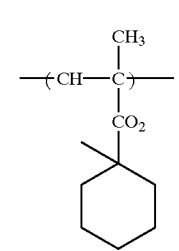

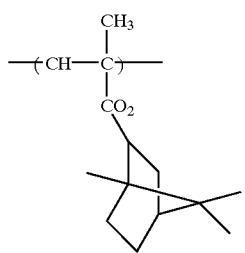
[IIa-17]
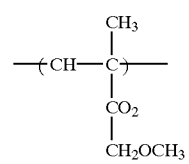
[IIa-18]
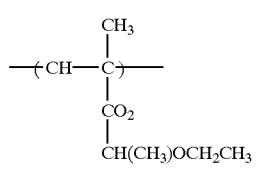
[IIa-19]
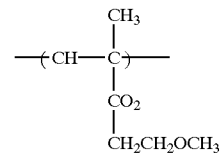
[IIa-20]
Specific examples of the repeating unit represented by the foregoing general formula (IIb) will be given below, but the present invention should not be construed as being limited thereto.
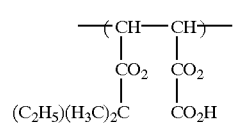
[IIb-1]
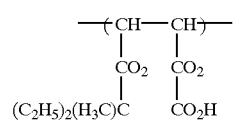
[IIb-2]
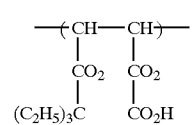
[IIb-3]
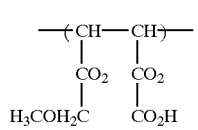
[IIb-4]
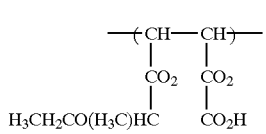
[IIb-5]
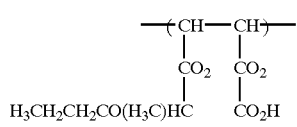
[IIb-6]
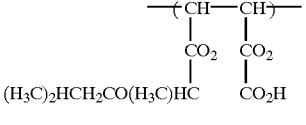
[IIb-7]
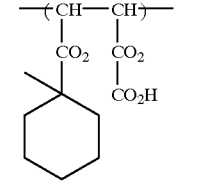
[IIb-8]
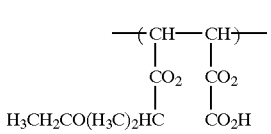
[IIb-9]
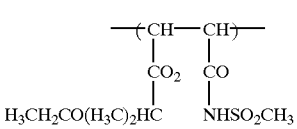
[IIb-10]
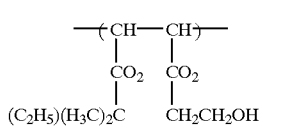
[IIb-11]
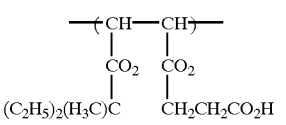
[IIb-12]
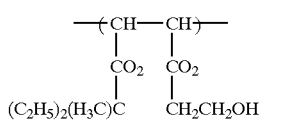
[IIb-13]
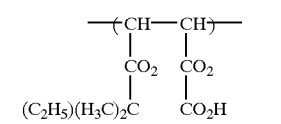
[IIb-14]
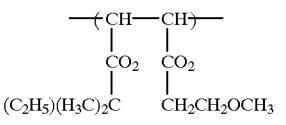
[IIb-15]
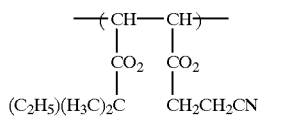
[IIb-16]
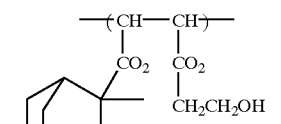
[IIb-17]

[IIb-18] 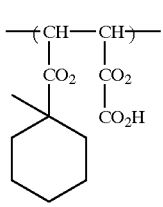

[IIb-19] 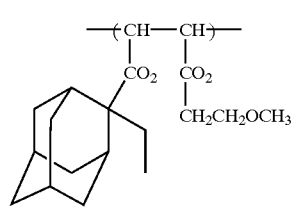

[IIb-20] 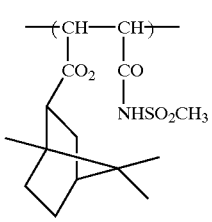

[IIb-21] 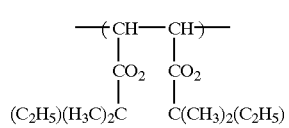

[IIb-22] 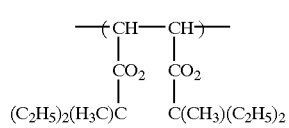

[IIb-23] 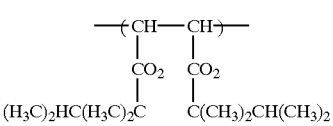

[IIb-24] 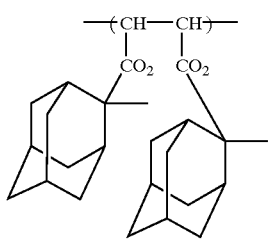

[IIb-25] 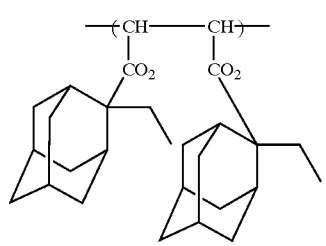

[IIb-26] 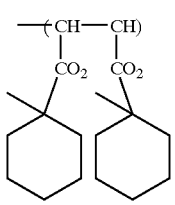

[IIb-27] 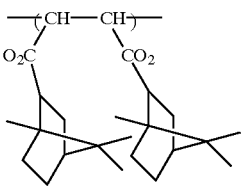

[IIb-28] 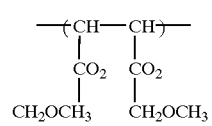

[IIb-29] 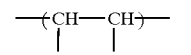

In the repeating unit (III), Z represents an oxygen atom or N—$R^3$. $R^3$ represents a hydrogen atom, hydroxyl group, straight-chain or branched alkyl group or —O—$SO_2$—$R^4$. $R^4$ represents an alkyl group or trihalomethyl group. The alkyl group represented by $R^3$ or $R^4$ is preferably a $C_{1-10}$ straight-chain or branched alkyl group. Preferred among these alkyl groups is $C_{1-6}$ straight-chain or branched alkyl group. Particularly preferred among these alkyl groups are methyl group, ethyl group, n-propyl group, i-propyl group, n-butyl group, i-butyl group, s-butyl group, and t-butyl group.

Specific examples of the repeating unit represented by the foregoing general formula (III) will be given below, but the present invention should not be construed as being limited thereto.

[I'-1] 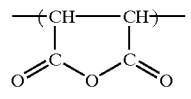

[I'-2] 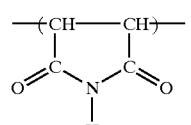

[I'-3] 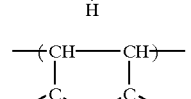

[I'-4] 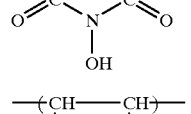

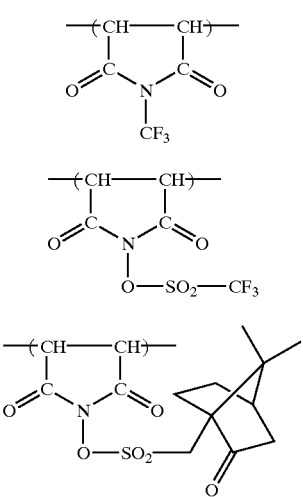

The resin according to the invention is obtained by copolymerizing the following monomers such that they give repeating units constituting the resin so far as the effect of the invention can be effectively given. However, the present invention is not limited to the following monomers.

In this manner, properties required for the foregoing resin, particularly (1) solubility in the coating solvent, (2) film-forming properties (glass transition point), (3) developability with an alkali, (4) film thickness loss (selectivity of hydrophilicity or hydrophobicity, alkali solubility), (5) close contact with the substrate on the unexposed area, and (6) dry etching resistance can be finely adjusted.

Examples of the copolymerizable monomers include compounds having one addition-polymerizable unsaturated bond selected from the group consisting of acrylic acid ester, methacrylic acid ester, acrylamide, methacrylamide, allyl compound, vinyl ether and vinyl ester.

Specific examples of the copolymerizable monomers include acrylic acid esters such as alkyl (preferably having from 1 to 10 carbon atoms) acrylate (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate); methacrylic acid esters such as alkyl (preferably having from 1 to 10 carbon atoms) methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate); acrylamides such as acrylamide, N-alkyl acrylamide (the alkyl moiety is preferably a $C_{1-10}$ alkyl group such as methyl group, ethyl group, propyl group, butyl group, t-butyl group, heptyl group, octyl group, cyclohexyl group and hydroxyethyl group), N,N-dialkylacrylamide (the alkyl moiety is preferably a $C_{1-10}$ alkyl group such as methyl group, ethyl group, butyl group, isobutyl group, ethylhexyl group and cyclohexyl group), N-hydroxyethyl-N-methylacrylamide and N-2-acetamideethyl-N-acetylacrylamide; methacrylamides such as methacrylamide, N-alkyl methacrylamide (the alkyl moiety is preferably a $C_{1-10}$ alkyl group such as methyl group, ethyl group, butyl group, isobutyl group, ethylhexyl group and cyclohexyl group), N,N-dialkylmethacrylamide (the alkyl moiety is preferably ethyl group, propyl group or butyl group) and N-hydroxyethyl-N-methyl methacrylamide; allyl compounds such as allyl ester (e.g., allyl acetate, allyl caproate, allyl caprylate, allyl laurate, allyl palmitate, allyl stearate, allyl benzoate, allyl acetoacetate, allyl lactate) and allyloxy ethanol; vinyl ethers such as alkyl vinyl ether (e.g., hexyl vinyl ether, octyl vinyl ether, decyl vinyl ether, ethyl hexyl vinyl ether, methoxy ethyl vinyl ether, ethoxy ethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylamino ethyl vinyl ether, diethylamino ethyl vinyl ether, butylamino ethyl vinyl ether, benzyl vinyl ether, tetrahydrofurfuryl vinyl ether); vinyl esters such as vinyl butyrate, vinyl isobutylate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl-β-phenyl butyrate and vinyl cyclohexyl carboxylate; itaconic acid dialkyls (e.g., itaconic acid dimethyl, itaconic acid diethyl, itaconic acid dibutyl); acrylic acid, methacrylic acid, crotonic acid, itaconic acid, acrylonitrile, and methacrylonitrile.

In the resin (A) of the invention, the content of the repeating unit represented by the general formula (I), at least one of the repeating units (IIa) and (IIb), and the repeating unit represented by the general formula (III) which is an optionally component to be preferably copolymerized, can be properly predetermined taking into account the desired oxygen plasma etching resistance and sensitivity of resist, cracking resistance of pattern, close contact with substrate, resist profile and general properties required for resist such as resolution and heat resistance. In general, the content of the repeating unit represented by the general formula (I) in the resin (A) of the invention is from 10 mol-% to 90 mol-%, preferably from 15 mol-% to 70 mol-%, more preferably from 20 mol-% to 50 mol-% based on the total amount of repeating units.

The content of at least one of the repeating units (IIa) and (IIb) is from 5 mol-% to 50 mol-%, preferably from 10 mol-% to 40 mol-% based on the total amount of repeating units.

The content of the repeating unit (III) is normally from 10 mol-% to 90 mol-%, preferably from 15 mol-% to 70 mol-%, more preferably from 20 mol-% to 60 mol-% based on the total amount of repeating units.

When the composition of the invention is used for ArF exposure system, it is preferred to use the resin having no aromatic ring from the standpoint of transparency to the ArF light.

The resin (A) of the invention can be obtained by the copolymerization of a monomer corresponding to the repeating unit represented by the general formula (I), a monomer corresponding to at least one of the repeating units represented by the general formulae (IIa) and (IIb), and optionally a monomer corresponding to the repeating unit represented by the general formula (III) in the presence of a polymerization catalyst. Alternatively, the resin (A) of the invention can be obtained by copolymerizing a monomer corresponding to the repeating unit represented by the general formula (I) and a monomer corresponding to the repeating unit (IIa) with maleic anhydride or by copolymerizing a monomer corresponding to the repeating unit represented by the general formula (I) with maleic anhydride, and then subjecting the repeating unit derived from maleic anhydride in the copolymer thus obtained to partial ring-opening esterification with alcohols or hydrolysis under basic or acidic conditions.

The weight-average molecular weight of the resin according to the invention is preferably from 1,000 to 200,000 in polystyrene equivalence as determined by GPC. When the weight-average molecular weight falls below 1,000, it is not too advantageous because the resulting resin exhibits deteriorated heat resistance and dry etching resistance. On the contrary, when the weight-average molecular weight exceeds 200,000, it is not too good because the resulting resin exhibits deteriorated developability and an extremely high viscosity that deteriorates its film-forming properties.

The mixing proportion of the resin (A) of the invention in the positive-working photoresist composition of the invention is preferably from 40% to 99.99% by weight, more preferably from 50% to 99.97% by weight based on the total solid content in the resist.

The onium salt compound (B') which generates an acid when irradiated with active ray or radiation (hereinafter referred to as "photo-acid generator") of the invention will be further described hereinafter.

Examples of such a photo-acid generator include various onium salt compounds used in the art which generate an acid when irradiated with active ray or radiation. In the present invention, sulfonium salt compounds and iodonium salt compounds are preferred. Examples of the acid thus generated include sulfonic acid, carboxylic acid, disulfonylimide, and N-sulfonylimide.

Preferred examples of the photo-acid generator employable herein include iodonium salt represented by the following general formula (PAG3) and sulfonium salt represented by the general formula (PAG4).

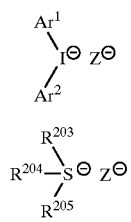

In the foregoing general formulae (PAG3) and (PAG4), $Ar^1$ and $Ar^2$ each independently represents a substituted or unsubstituted aryl group. Preferred examples of substituents on the substituted aryl group include alkyl group, haloalkyl group, cycloalkyl group, aryl group, alkoxy group, nitro group, carboxyl group, alkoxycarbonyl group, acyl group, acyloxy group, hydroxyl group, mercapto group, and halogen atom.

$R^{203}$, $R^{204}$ and $R^{205}$ each independently represents a substituted or unsubstituted alkyl or aryl group, preferably a $C_{6-14}$ aryl group, $C_{1-8}$ alkyl group or substitution derivative thereof. Preferred examples of substituents on the substituted alkyl or aryl group include alkyl group, haloalkyl group, cycloalkyl group, aryl group, alkoxy group, nitro group, carboxyl group, alkoxycarbonyl group, acyl group, acyloxy group, hydroxyl group, mercapto group, and halogen atom.

$Z^-$ represents a counter anion. Examples of such a counter anion include perfluoroalkanesulfonic acid anion such as $BF_4^-$, $AsF_6^-$, $PF_6^-$, $SbF_6^-$, $SiF_6^-$, $ClO_4^-$ and $CF_3SO_3^-$, sulfonic acid anion having aliphatic hydrocargon group or aromatic hydrocarbon group such as pentafluorobenzenesulfonic acid anion and naphthalene-1-sulfonic acid anion, anthraquinonesulfonic acid anion, and sulfonic acid group-containing dye. The present invention is not limited to these counter anions.

Two of $R^{203}$, $R^{204}$ and $R^{205}$ and $Ar^1$ and $Ar^2$ may be connected to each other via the respective single bond or substituent.

Specific examples of the foregoing photo-acid generator include the compounds exemplified below, but the present invention should not be construed as being limited thereto.

(PAG3-1)
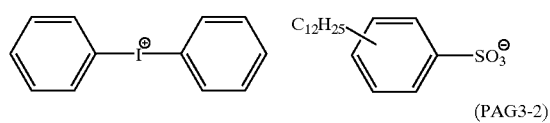

(PAG3-2)
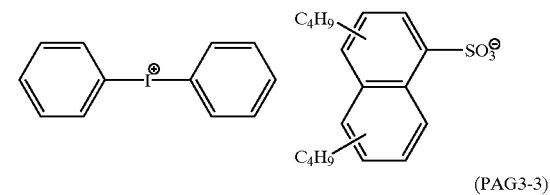

(PAG3-3)
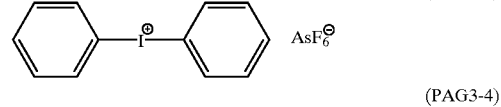

(PAG3-4)
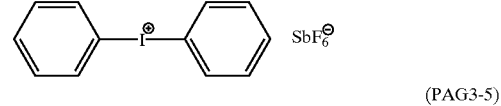

(PAG3-5)
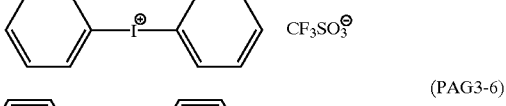

(PAG3-6)
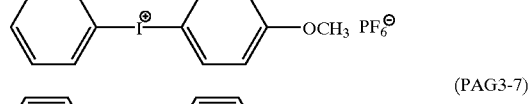

(PAG3-7)
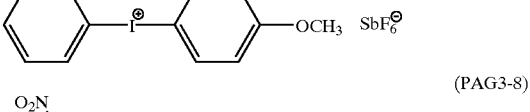

(PAG3-8)
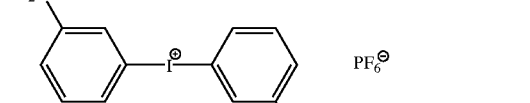

(PAG3-9)
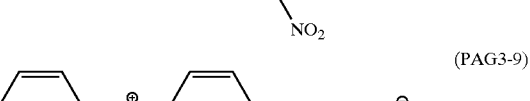

(PAG3-10)
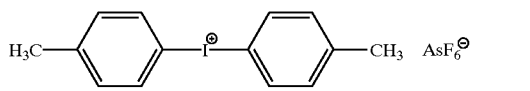

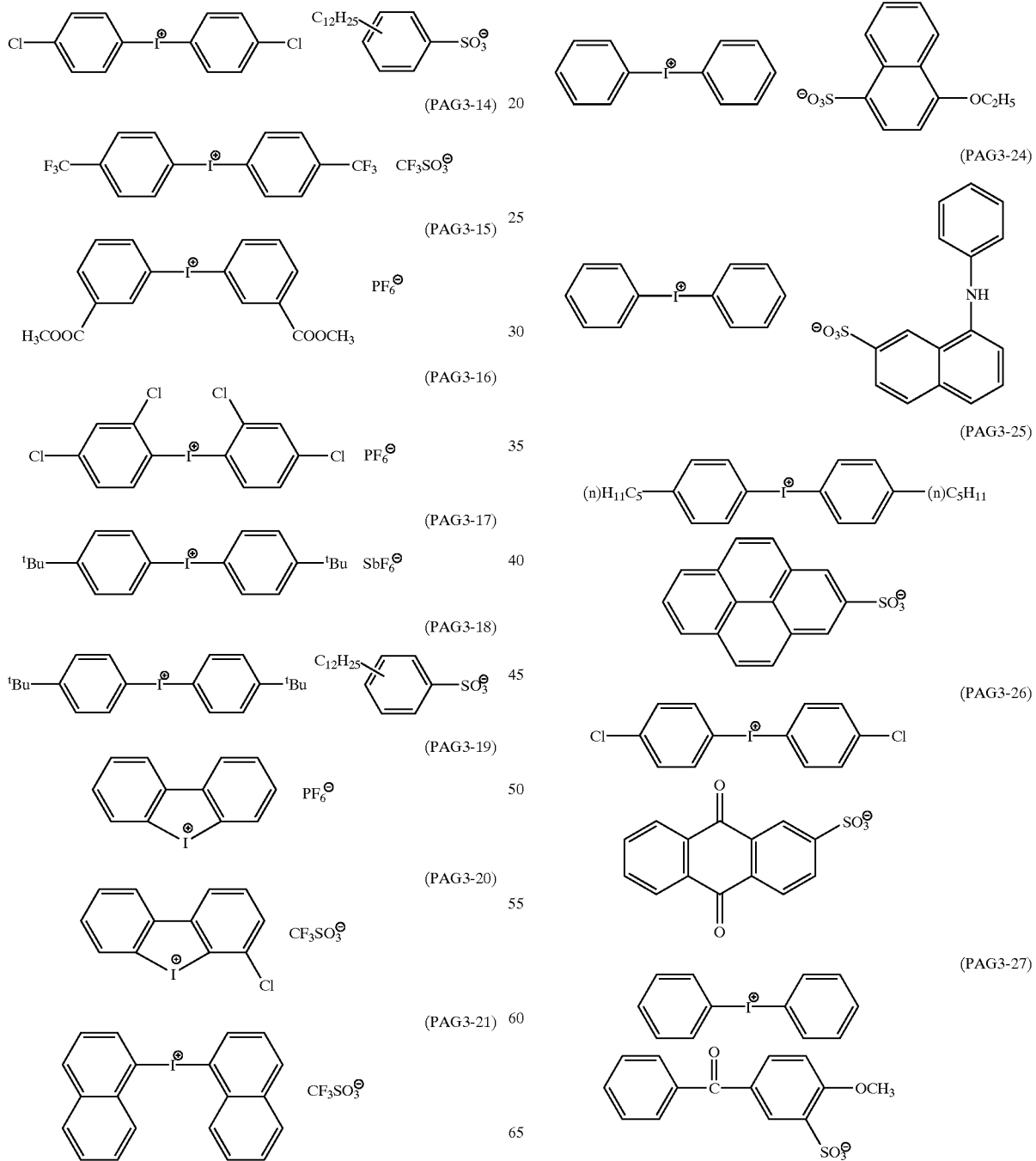

(PAG3-28)
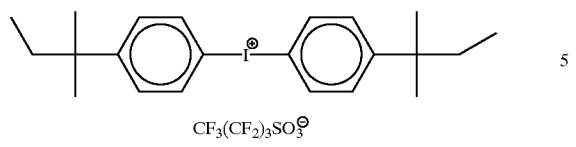
(PAG3-29)
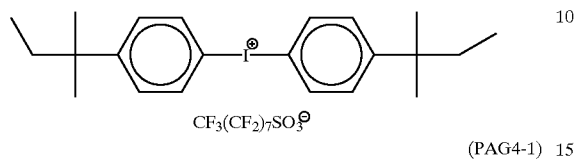
(PAG4-1)
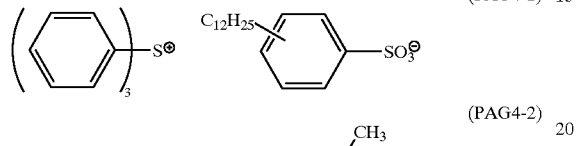
(PAG4-2)
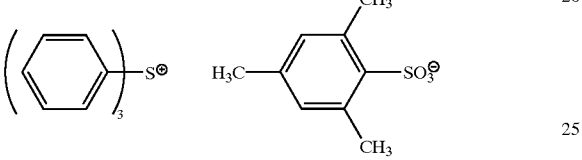
(PAG4-3)
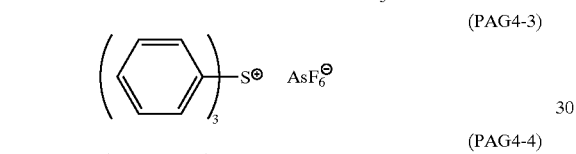
(PAG4-4)
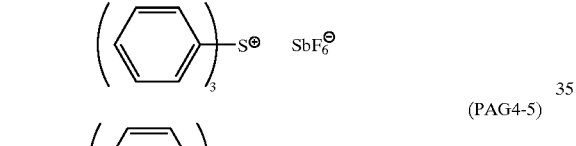
(PAG4-5)
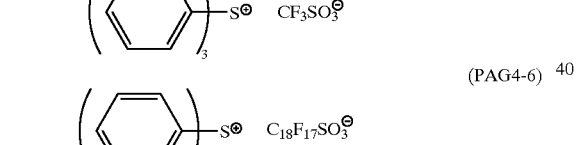
(PAG4-6)
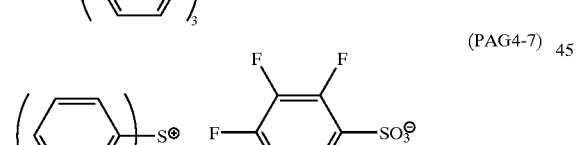
(PAG4-7)
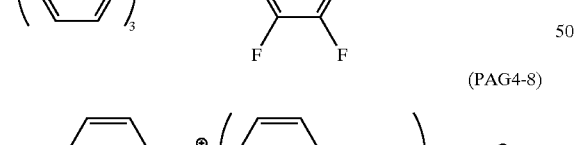
(PAG4-8)
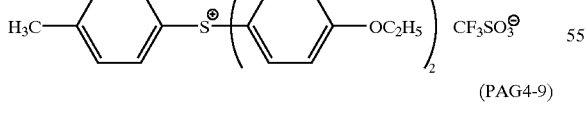
(PAG4-9)
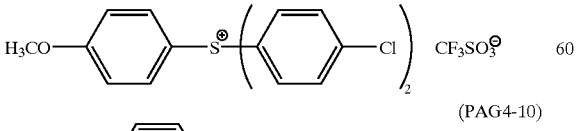
(PAG4-10)
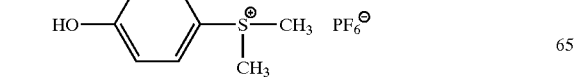
(PAG4-11)
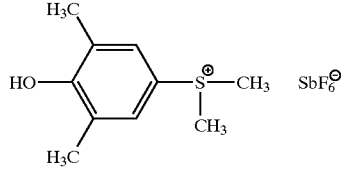
(PAG4-12)
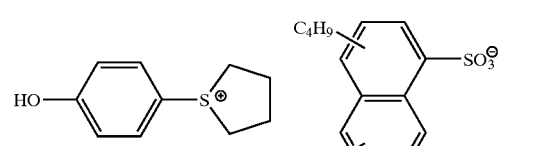
(PAG4-13)
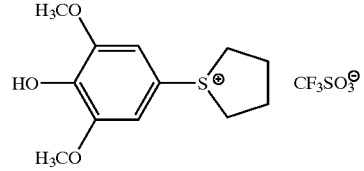
(PAG4-14)
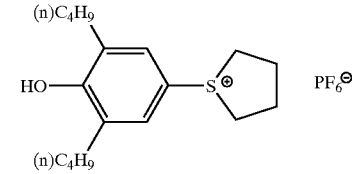
(PAG4-15)
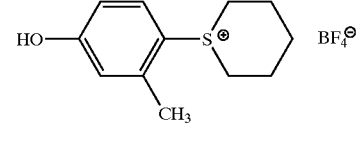
(PAG4-16)
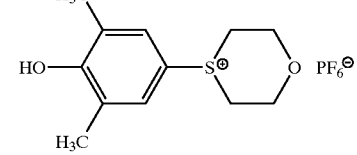
(PAG4-17)
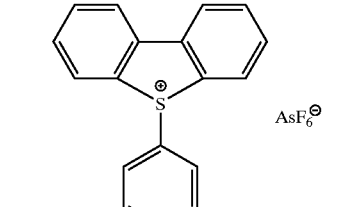
(PAG4-18)
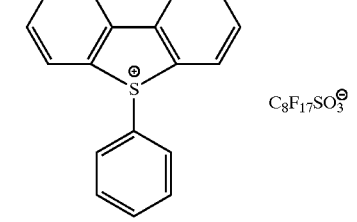

-continued
(PAG4-19) 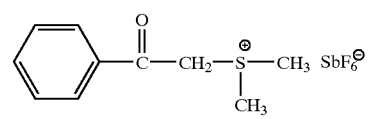
(PAG4-20) 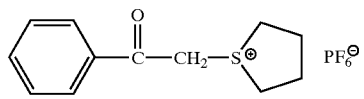
(PAG4-21) 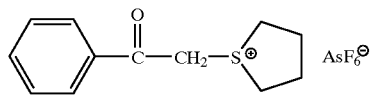
(PAG4-22) 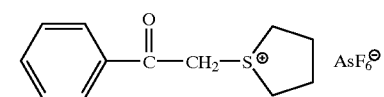
(PAG4-23) 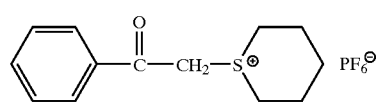
(PAG4-24) 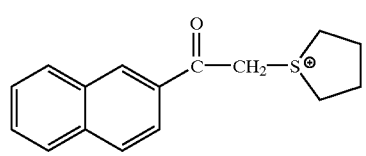
(PAG4-25) 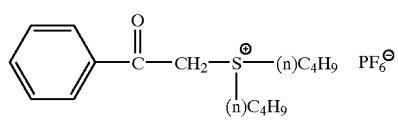
(PAG4-26)
(PAG4-27)
(PAG4-28) 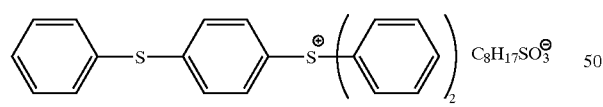 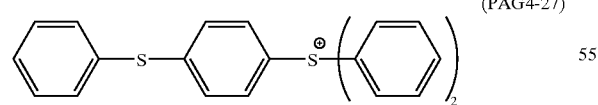 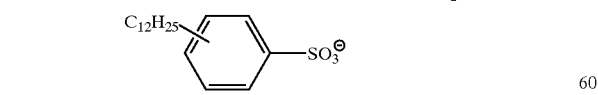 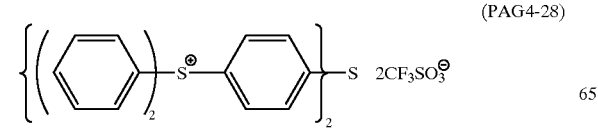
-continued
(PAG4-29) 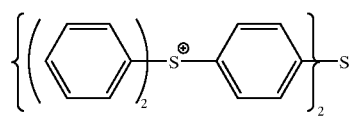
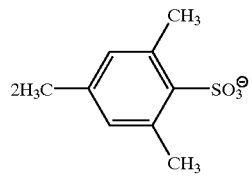
(PAG4-30) 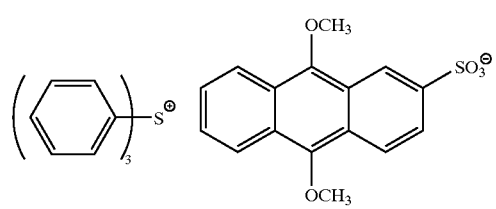
(PAG4-31) 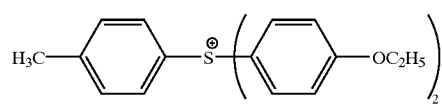
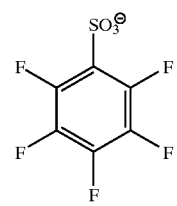
(PAG4-32) 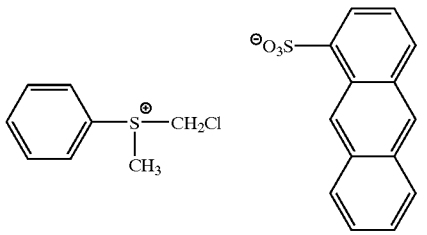
(PAG4-33) 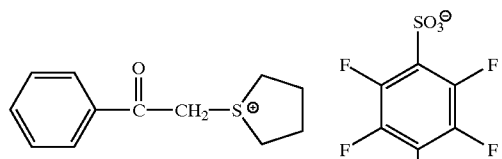
(PAG4-34) 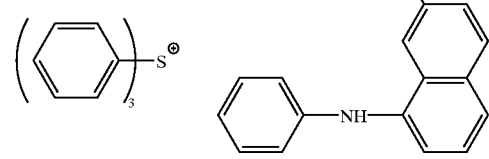

(PAG4-35)

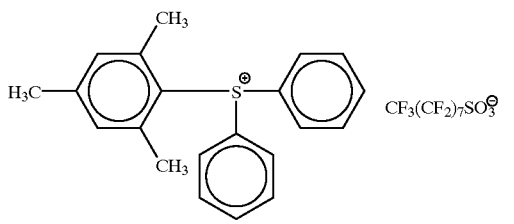

(PAG4-36)

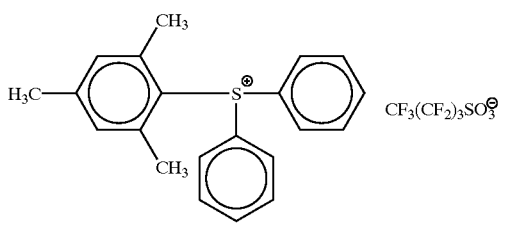

(PAG4-37)

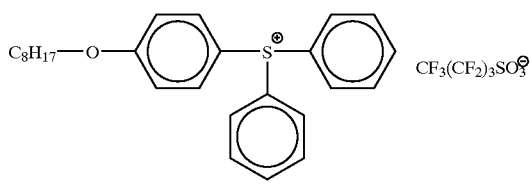

The onium salt represented by the general formula (PAG3) or (PAG4) can be synthesized by the method as disclosed in J. W. Knapczk et al., "J. Am. Chem. Soc.", 91, 145 (1969), A. L. Maycok et al., "J. Org. Chem.", 35, 2532, (1970), E. Goethas et al., "Bull. Soc. Chem. Belg.", 73, 546, (1964), H. M. Leisester, "J. Ame. Chem. Soc.", 51, 3587 (1929), J. V. Crivello et al., "J. Polym. Chem. Ed.", 18, 2677 (1980), U.S. Pat. Nos. 2,807,648 and 4,247,473, and JP-A-53-101,331.

In the present invention, as the photo-acid generator there is most preferably used a photo-acid generator represented by the foregoing general formula [sI] or [sII]. In this arrangement, the number of particles in the resist composition solution and the number of particles increased in the resist solution after aging storage can be lessened.

Examples of the alkyl groups represented by Rs1 to Rs5 in the general formulae [sI] or [sII] include $C_{1-25}$ alkyl group such as methyl group, ethyl group, propyl group, n-butyl group, isobutyl group, sec-butyl group, t-butyl group, pentyl group, hexyl group, heptyl group, octyl group, t-amyl group, decanyl group, dodecanyl group and hexadecanyl group each of which may have a substituent. Examples of the cycloalkyl groups represented by Rs1 to Rs5 include $C_{3-25}$ cycloalkyl group such as cyclopropyl group, cyclopentyl group, cyclohexyl group, cyclooctyl group, cyclododecanyl group and cyclohexadecanyl group each of which may have a substituent. Examples of the alkoxy groups represented by Rs1 to Rs5 include $C_{1-25}$ alkoxy group such as methoxy group, ethoxy group, propoxy group, isopropoxy group, n-butoxy group, isobutoxy group, sec-butoxy group, t-butoxy group, pentyloxy group, t-amyloxy group, n-hexyloxy group, n-octyloxy group and n-dodecaneoxy group each of which may have a substituent.

Examples of the alkoxycarbonyl group represented by Rs1 to Rs5 include $C_{2-25}$ alkoxycarbonyl group such as methoxycarbonyl group, ethoxycarbonyl group, propoxycarbonyl group, isopropoxycarbonyl group, n-butoxycarbonyl group, isobutoxycarbonyl group, sec-butoxycarbonyl group, t-butoxycarbonyl group, pentyloxycarbonyl group, t-amyloxycarbonyl group, n-hexyloxycarbonyl group, n-octyloxycarbonyl group and n-dodecaneoxycarbonyl group each of which may have a substituent. Examples of the acyl group represented by Rs1 to Rs5 include $C_{1-25}$ acyl group such as formyl group, acetyl group, butyryl group, valeryl group, hexanoyl group, octanoyl group, t-butylcarbonyl group and t-amylcarbonyl group each of which may have a substituent. Examples of the acyloxy group represented by Rs1 to Rs5 include $C_{2-25}$ acyloxy group such as acetoxy group, ethyryloxy group, butyryloxy group, t-butyryloxy group, t-amylyloxy group, n-hexanecarbonyloxy group, n-octanecarbonyloxy group, n-dodecanecarbonyloxy group and n-hexadecanecarbonyloxy group each of which may have a substituent. Examples of the halogen atom include fluorine atom, chlorine atom, bromine atom, and iodine atom.

Preferred examples of substituents on these groups include $C_{1-4}$ alkoxy group, halogen atom (e.g., fluorine atom, chlorine atom, bromine atom, iodine atom), $C_{2-5}$ acyl group, $C_{2-5}$ acyloxy group, cyano group, hydroxyl group, carboxy group, $C_{2-5}$ alkoxycarbonyl group, and nitro group.

When the number of each substituents Rs1 to Rs5 in the formulae [sI] or [sII] is two or more, the plural groups may be the same or different.

As mentioned above, at least one of the substituents Rs1 and Rs2 in the formula [sI] represents an alkyl group having 5 or more carbon atoms which may have a substituent, cycloalkyl group having 5 or more carbon atoms which may have a substituent, alkoxy group having 5 or more carbon atoms which may have a substituent, alkoxycarbonyl group having 5 or more carbon atoms which may have a substituent, acyl group having 5 or more carbon atoms which may have a substituent, and acyloxy group having 5 or more carbon atoms which may have a substituent.

Examples of substituents on the groups having 5 or more carbon atoms include those having from 5 to 25 carbon atoms among the foregoing specific examples.

When the sum of l, m and n is 1 in the formula [sII], Rs3 represents an alkyl group which may have a substituent, cycloalkyl group which may have a substituent, alkoxy group which may have a substituent, alkoxycarbonyl group which may have a substituent, acyl group which may have a substituent or acyloxy group which may have a substituent. Further, in this case Rs3 preferably has 2 or more carbon atoms, more preferably 4 or more carbon atoms.

Preferred among the alkyl groups having substituents represented by Rs1 to Rs5 are methyl group, ethyl group, propyl group, isopropyl group, butyl group, t-butyl group, n-pentyl group, t-amyl group, n-hexyl group, n-octyl group, and decanyl group. Preferred among the cycloalkyl groups represented by Rs1 to Rs5 are cyclohexyl group, cyclooctyl group and cyclododecanyl group each of which may have a substituent. Preferred among the alkoxy groups represented by Rs1 to Rs5 are methoxy group, ethoxy group, isopropoxy group, n-butoxy group, sec-butoxy group, t-butoxy group, pentyloxy group, t-amyloxy group, n-hexyloxy group, n-octyloxy group and n-dodecaneoxy group each of which may have a substituent. Preferred among the alkoxycarbonyl groups represented by Rs1 to Rs5 are methoxycarbonyl group, ethoxycarbonyl group, isopropoxycarbonyl group, n-butoxycarbonyl group, sec-butoxycarbonyl group, t-butoxycarbonyl group, pentyloxycarbonyl group, t-amyloxycarbonyl group, n-hexyloxycarbonyl group, n-octyloxycarbonyl group and n-dodecaneoxycarbonyl group each of which may have a substituent. Preferred among the acyl groups represented by Rs1 to Rs5 are formyl group, acetyl group, butyryl group, valeryl group, hexanoyl group, octanoyl group, t-butylcarbonyl group and t-amylcarbonyl group each of which may have a substituent. Preferred among the acyloxy groups represented by Rs1 to Rs5 are acetoxy group, ethyryloxy group, butyryloxy group, t-butyryloxy group, t-amylyloxy group, n-hexanexarebonyloxy group and n-octanecarbonyloxy group each of which may have a substituent.

Preferred examples of the alkyl group having 5 or more carbon atoms which may have a substituent include n-pentyl group, t-amyl group, n-hexyl group, n-octyl group, and decanyl group. Preferred examples of the cycloalkyl group having 5 or more carbon atoms which may have a substituent include cyclohexyl group, cyclooctyl group, and cyclododecanyl group. Preferred examples of the alkoxy group having 5 or more carbon atoms which may have a substituent include pentyloxy group, t-amyloxy group, hexyloxy group, n-octyloxy group, and dodecaneoxy group. Preferred examples of the alkoxycarbonyl group having 5 or more carbon atoms which may have a substituent include pentyloxycarbonyl group, t-amyloxycarbonyl group, hexyloxycarbonyl group, n-octyloxycarbonyl group, and dodecaneoxycarbonyl group. Preferred examples of the acyl group having 5 or more carbon atoms which may have a substituent include valeryl group, hexanoyl group, octanoyl group, and t-amylcarbonyl group. Preferred examples of the acyloxy group having 5 or more carbon atoms which may have a substituent include t-amylyloxy group, n-hexanecarbonyloxy group, and n-octanecarbonyloxy group.

Preferred examples of substituents on these groups include methoxy group, ethoxy group, t-butoxy group, chlorine atom, bromine atom, cyano group, hydroxyl group, methoxycarbonyl group, ethoxycarbonyl group, t-butoxycarbonyl group, and t-amyloxycarbonyl group.

The sulfonium or iodonium compound represented by the general formula [sI] or [sII] to be used in the invention comprises as its counter anion $X^-$ a sulfonic acid having a specific structure as mentioned above.

Examples of the aliphatic hydrocarbon group represented by R which may have a substituent in the counter anion include $C_{1-20}$ straight-chain or branched alkyl group, and cyclic alkyl group. Examples of R include aromatic group which may have a substituent.

Examples of the alkyl group represented by R include $C_{1-20}$ alkyl group such as methyl group, ethyl group, propyl group, n-butyl group, n-pentyl group, n-hexyl group, n-octyl group, 2-ethylhexyl group, decyl group and dodecyl group each of which may have a substituent. Examples of the cyclic alkyl group represented by R include cyclopentyl group, cyclohexyl group, cyclooctyl group, cyclododecyl group, adamanthyl group, nornornyl group, camphor group, tricyclodecanyl group and menthyl group each of which may have a substituent. Examples of the aromatic group represented by R include phenyl group and naphthyl group each of which may have a substituent.

Preferred among the alkyl groups represented by R which may have a substituent are methyl group, trifluoromethyl group, ethyl group, pentafluoroethyl group, 2,2,2-trifluoroethyl group, n-propyl group, n-butyl group, nonafluorobutyl group, n-pentyl group, n-hexyl group, n-octyl group, heptadecafluorooctyl group, 2-ethylhexyl group, decyl group, and dodecyl group. Preferred among the cyclic alkyl groups represented by R which may have a substituent are cyclopentyl group, cyclohexyl group, and camphor group. Preferred among the aromatic groups represented by R are phenyl group, naphthyl group, pentafluorophenyl group, p-toluil group, p-fluorophenyl group, p-chlorophyenyl group, p-hydroxyphenyl group, p-methoxyphenyl group, dodecylphenyl group, mesityl group, triisopropylphenyl group, 4-hydroxy-1-naphthyl group and 6-hydroxy-2-naphthyl group each of which may have a substituent.

Preferred among the foregoing various substituents represented by Rs1 to Rs5 are methyl group, ethyl group, propyl group, isopropyl group, n-butyl group, t-butyl group, n-pentyl group, t-amyl group, n-hexyl group, n-octyl group, cyclohexyl group, methoxy group, ethoxy group, isopropoxy group, n-butoxy group, t-butoxy group, pentyloxy group, t-amyloxy group, hexyloxy group, n-octyloxy group, methoxycarbonyl group, ethoxycarbonyl group, n-butoxycarbonyl group, t-butoxycarbonyl group, t-amyloxycarbonyl group, hexyloxycarbonyl group, n-octyloxycarbonyl group, formyl group, acetyl group, butyryl group, hexanonyl group, octanoyl group, t-butylcarbonyl group, t-amylcarbonyl group, acetoxy group, ethyryloxy group, butyryloxy group, t-butyryloxy group, t-amylyloxy group, n-hexanecarbonyloxy group, n-octanecarbonyloxy group, hydroxyl group, chlorine atom, bromine atom, and nitro group.

Even more desirable among the substituents having 5 or more carbon atoms are n-pentyl group, t-amyl group, n-hexyl group, n-octyl group, decanyl group, cyclohexyl group, pentyloxy group, t-amyloxy group, hexyloxy group, n-octyloxy group, dodecaneoxy group, pentyloxycarbonyl group, t-amyloxycarbonyl group, hexyloxycarbonyl group, n-octyloxycarbonyl group, dodecaneoxycarbonyl group, valeryl group, hexanoyl group, octanoyl group, t-amylcarbonyl group, t-amylyloxy group, n-hexanecarbonyloxy group, and n-octanecarbonyloxy group.

Even more desirable among the sulfonic acid substituents R are methyl group, trifluoromethyl group, ethyl group, pentafluoroethyl group, 2,2,2-trifluoroethyl group, n-butyl group, nonafluorobutyl group, n-hexyl group, n-octyl group, heptadecafluorooctyl group, 2-ethylhexyl group, camphor group, phenyl group, naphthyl group, pentafluorophenyl group, p-toluil group, p-fluorophenyl group, p-chlorophenyl group, p-methoxyphenyl group, dodecylphenyl group, mesityl group, triisopropylphenyl group, 4-hydroxy-1-naphthyl group, and 6-hydroxy-2-naphthyl group.

Of these, fluorinated aliphatic hydrocarbon group and fluroinated aromatic hydrocarbon group are preferred due to the particularly excellent sensitivity and solution storage stability, and specific examples thereof include trifluoromethyl group, pentrafluoromethyl group, 2,2,2-trifluoroethyl group, nonafluorobutyl group, heptadecafluorooctyl group and pentafluorophenyl group.

The total number of carbon atoms in the acid thus generated is preferably from 1 to 30, more preferably from 1 to 28, even more preferably from 1 to 25. When the total number of carbon atoms falls below 1, the resulting resin finds difficulty in pattern formation such as t-top. On the contrary, when the total number of carbon atoms exceeds 30, it is disadvantageous in that development residue occurs.

Specific examples of the compound represented by the general formula [sI] or [sII] include those represented by the following general formulae [sI-1] to [sI-18] and [sII-1] to [sII-17], but the present invention should not be construed as being limited thereto. These compounds may be used singly or in combination of two or more thereof.

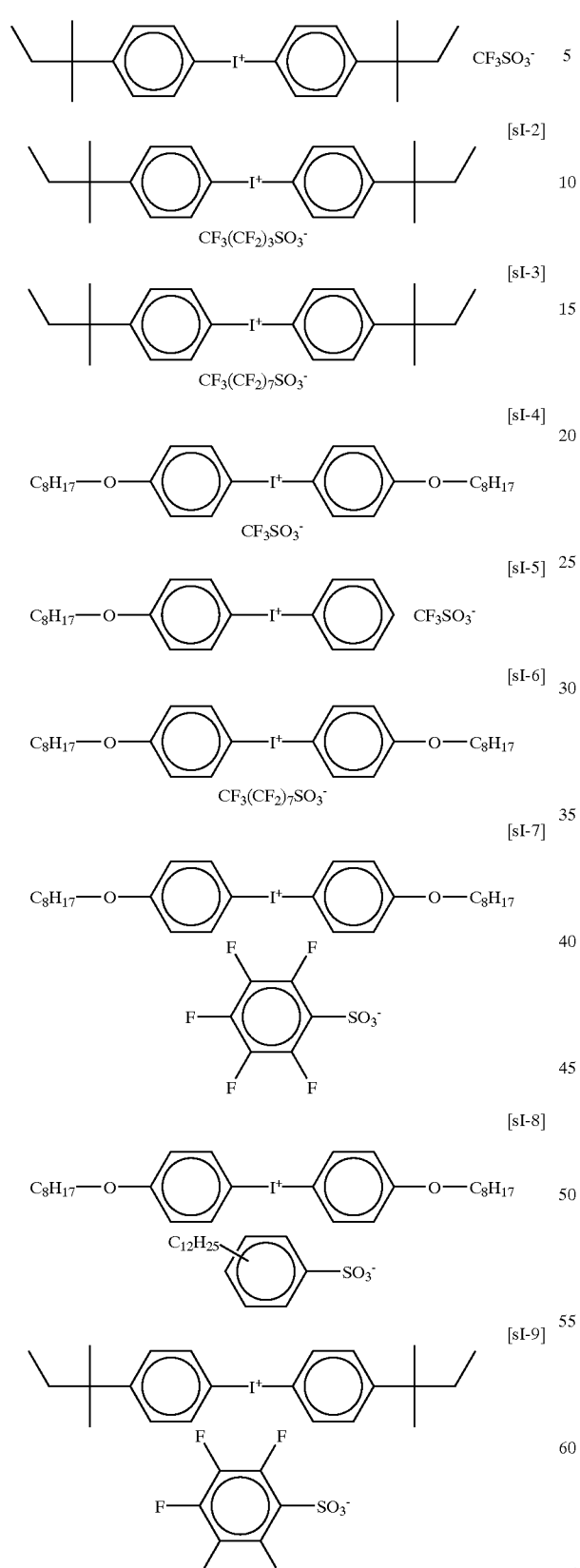
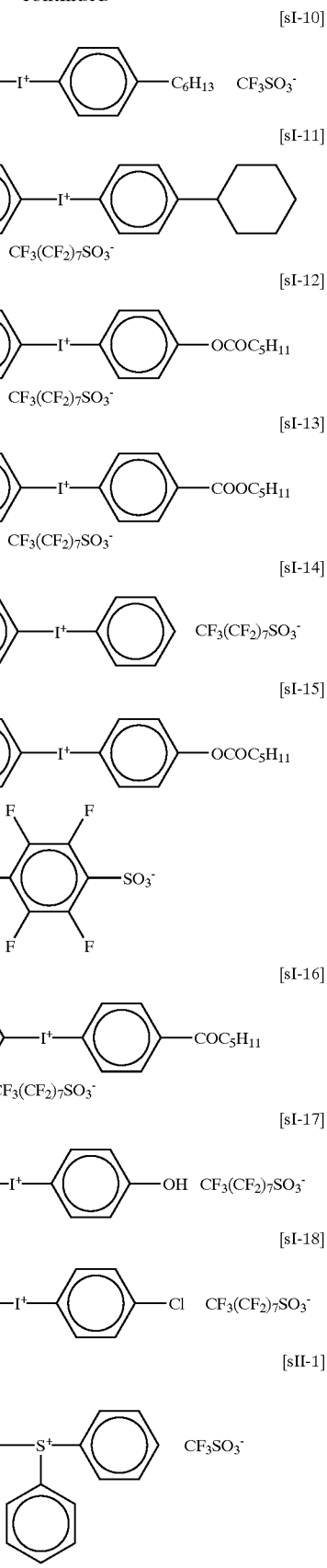

[sII-2]
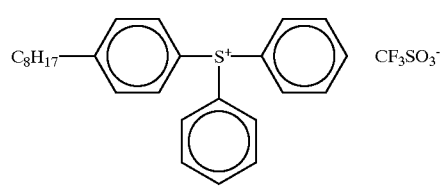
[sII-3]
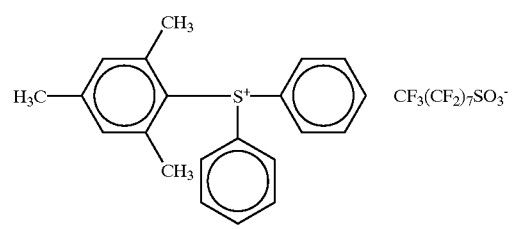
[sII-4]
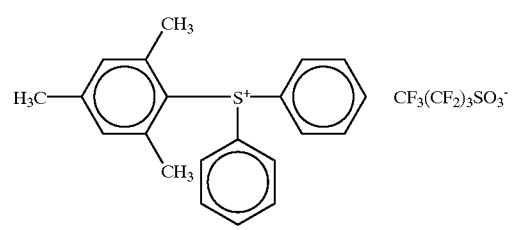
[sII-5]
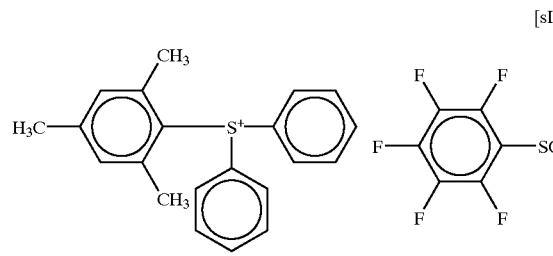
[sII-6]
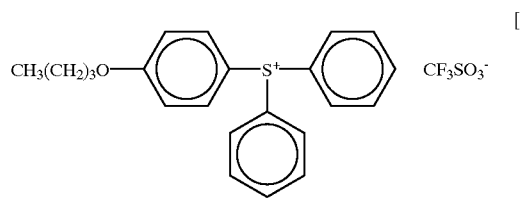
[sII-7]
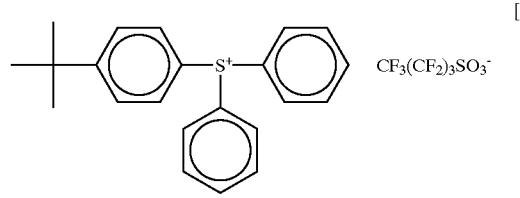
[sII-8]
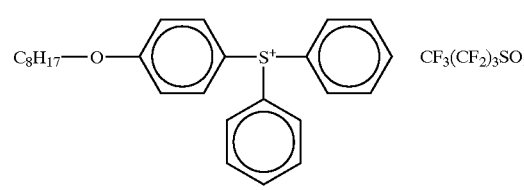
[sII-9]
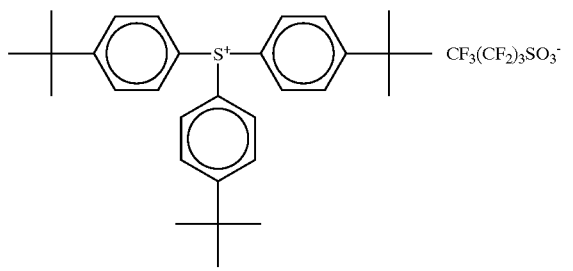
[sII-10]
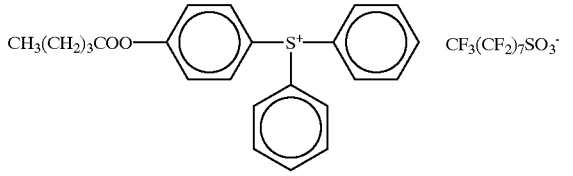
[sII-11]
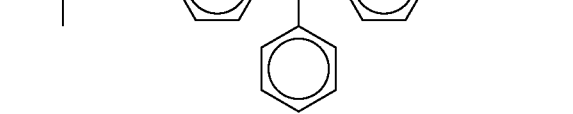
[sII-12]
[sII-13]
[sII-14]
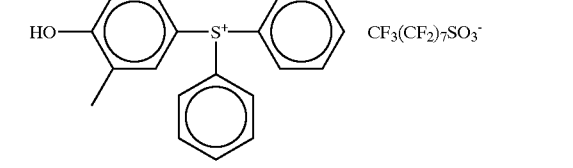
[sII-15]
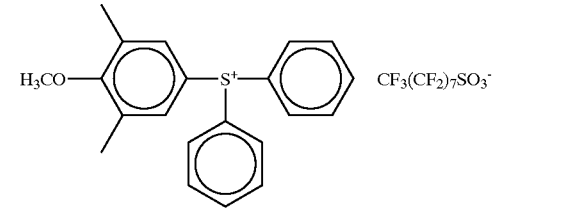

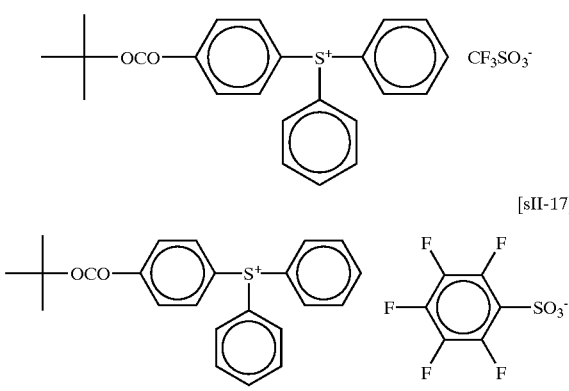

The photo-acid generator which can be incorporated in the positive-working photoresist composition of the invention with the compound represented by the general formula [sI] or [sII] which generates an acid when irradiated with active ray or radiation (photo-acid generator) will be described hereinafter.

As the compound which decomposes to generate an acid when irradiated with active ray or radiation there may be used, besides the foregoing compound, one properly selected from the group consisting of cationic photopolymerization initiator, radical photopolymerization initiator, optical decolorizer for dyes, optical discolorizer, compound which generates an acid when irradiated with known light for use in the formation of microresist, etc. (e.g., ultraviolet ray having a wavelength of from 200 nm to 400 nm, far ultraviolet ray, particularly g-line, i-line, KrF excimer laser beam, ArF excimer laser beam, electronic ray, X ray, molecular ray, ion beam), and mixture thereof.

Other examples of the compound which generates an acid when irradiated with active ray or radiation include diazonium salts disclosed in S. I. Schlesinger, "Photogr. Sci. Eng.", 18, 387 (1974), T. S. Bal et al., "Polymer", 21, 423 (1980), ammonium salts disclosed in U.S. Pat. Nos. 4,069,055, 4,069,056, U.S. Pat. No. Re 27,992, and JP-A-3-140140, phosphonium salts disclosed in D. C. Necker et al., "Macromolecules", 17, 2468 (1984, C. S. Wen et al., "Teh. Proc. Conf. Rad. Curing", ASIA, page 478, Tokyo, October 1988, and U.S. Pat. Nos. 4,069,055 and 4,069,056, iodonium salts disclosed in J. V. Crivello et al., "Macromorecules", 10 (6), 1307 (1977), Chem. & Eng. News, Nov. 28, page 31 (1988), EP 104,143, U.S. Pat. Nos. 339,049 and 410,201, JP-A-2-150,848 and JP-A-2-296,514, sulfonium salts disclosed in J. V. Crivello et al., "Polymer J.", 17, 73 (1985), J. V. Crivello et al., "J. Org. Chem.", 43, 3055 (1978), W. R. Watt et al., "J. Polymer Sci.", Polymer Chem. Ed., 22, 1789 (1984), J. V. Crivello et al., "polymer Bull", 14, 279 (1985), H. V. Crivello et al., "Macromorecules", 14 (5), 1141 (1981), J. V. Crivello et al., "J. Polymer Sci.", Polymer Chem. Ed., 17, 2877 (1979), EP 370,693, 161,811, 410,201, 339,049, 233,567, 297,443, 297,442, U.S. Pat. Nos. 3,902,114, 4,933, 377, 4,760,013, 4,734,444 and 2,833,827, German Patents 2,904,626, 3,604,580 and 3,604,581, and JP-A-7-28237 and JP-A-8-27102, selenonium salts disclosed in J. V. Crivello et al., "Macromorecules", 10 (6), 1307 (1977), and J. V. Crevillo et al., "J. Polymer Sci.", Polymer Chem. Ed., 17, 1047 (1979), onium salts such as arsonium salt disclosed in C. S. Wen et al., "Teh. Proc. Conf. Rad. Curing", ASIA, page 478, Tokyo, Oct (1988), organic halogen compounds disclosed in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339, organic metal/organic halogen compounds disclosed in K. Meier et al., "J. Rad. Curing", 13 (4), 26 (1986), T. P. Gill et al., "Inorg. Chem.", 19, 3007 (1980), D. Astruc, "Acc. Chem. Res.", 19 (12), 377 (1986), and JP-A-2-161445, photo-acid generators having O-nitrobenzyl type protive group disclosed in S. Hayase et al., "J. Polymer Sci.", 25, 753 (1987), E. Reichmanis et al., "J. Polymer Sci.", Polymer Chem. Ed., 23, 1 (1985), Q. Q. Zhu et al., "J. Photochem.", 36, 85, 39, 317 (1987), B. Amit et al., "Tetrahedron Lett.", (24) 2205 (1973), D. H. R. Barton et al., "J. Chem. Soc.", 3571 (1965), P. M. Collins et al., "J. Chem. Soc.", Perkin I, 1695 (1975), M. Rudinstein et al., "Tetrahedron Lett.", (17), 1445 (1975), J. W. Walker et al., "J. Am. Chem. Soc.", 110, 7170 (1988), S. C. Busman et al., "J. Imaging Technol.", 11 (4), 191 (1985), H. M. Houlihan et al., "Macromolecules", 21, 2001 (1988), P. M. Collins et al., "J. Chem. Soc.", Chem. Commun., 532 (1972), S. Hayase et al., "Macromolecules", 18, 1799 (1985), E. Reichman et al., "J. Electrochem. Soc.", Solid State Sci. Technol., 130 (6), F. M. Houlihan et al., "Macromolecules", 21, 2001 (1988), EP 0290,750, EP 4,181,531, JP-A-60-198538 and JP-A-53-133022, compounds which undergo photodecomposition to generate a sulfonic acid such as iminosulfonate disclosed in M. Tunooka et al., "Polymer Preprints Japan", 35 (8), G. Berner et al., "J. Rad. Curing", 13 (4), W. J. Mijs et al., "Coating Technol.", 55 (697), 45 (1983), Akzo, H. Adachi et al., "Polymer Preprints", Japan, 37 (3), EP 4,371, 605, EP 84515, EP 044,115, EP 618,564, EP 0101,122, U.S. Pat. Nos. 4,371,605 and 4,431,774, JP-A-64-18143, JP-A-2-245756, and JP-A-3-140109, disulfone compounds disclosed in JP-A-61-166544 and JP-A-2-71270, and diazoketosulfon and diazosulfon compounds disclosed in JP-A-3-103854, JP-A-3-103856 and JP-A-4-210960.

Alternatively, a compound comprising such a group or compound which generates an acid when irradiated with light incorporated in the main or side chains of a polymer may be used such as one disclosed in M. E. Woodhouse et al., "J. Am. Chem. Soc.", 104, 5586 (1982), S. P. Pappas et al., "J. Imaging Sci.", 30 (5), 218 (1986), S. Kondo et al., "Makromol. Chem.", Rapid Commun., 9, 625 (1988), Y. Yamada et al., "Makromol. Chem.", 152, 153, 163 (1972), J. V. Crivello et al., "J. Polymer Sci.", Polymer Chem. Ed., 17, 3845 (1979), U.S. Pat. No. 3,849,137, German Patent 3914407, JP-A-63-26653, JP-A-55-164824, JP-A-62-69263, JP-A-63-146038, JP-A-63-163452, JP-A-62-153853, and JP-A-63-146029.

Still alternatively, a compound which generates an acid when irradiated with light may be used as disclosed in V. N. R. Pillai, "Synthesis", (1), 1 (1980), A. Abad et al. "Tetrahedron Lett.", (47) 4555 (1971), D. H. R. Barton et al., "J. Chem. Soc.", (C), 329 (1970), U.S. Pat. No. 3,779,778, and EP 126,712.

Among the foregoing compounds which generate an acid when irradiated with active ray or radiation, those which can be used particularly effectively will be described hereinafter.

(1) Oxazole derivative represented by the following general formula (PAG1) or S-triazine derivative represented by the following general formula (PAG2) substituted by trihalomethyl group

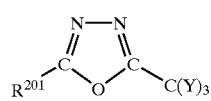 (PAG1)

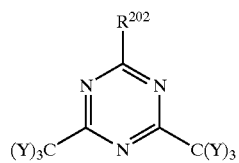 (PAG2)

wherein $R^{201}$ represents a substituted or unsubstituted aryl or alkenyl group; $R^{202}$ represents a substituted or unsubstituted aryl, alkenyl or alkyl group or —C(Y)$_3$; and Y represents a chlorine atom or bromine atom.

Specific examples of these compounds will be given below, but the present invention should not be construed as being limited thereto.

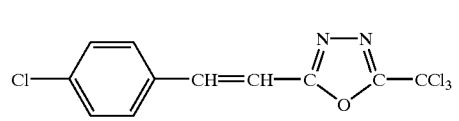 (PAG1-1)

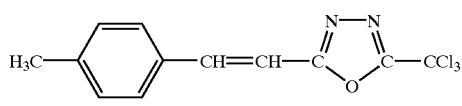 (PAG1-2)

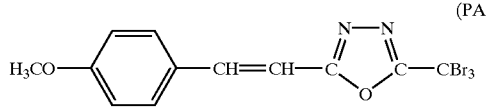 (PAG1-3)

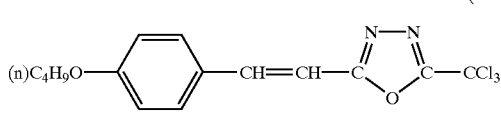 (PAG1-4)

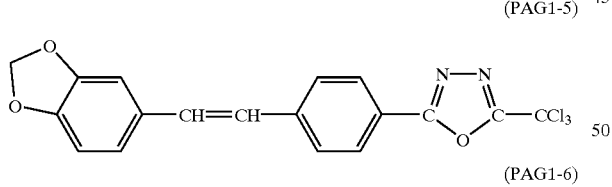 (PAG1-5)

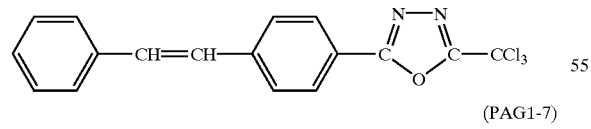 (PAG1-6)

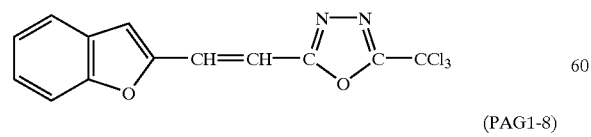 (PAG1-7)

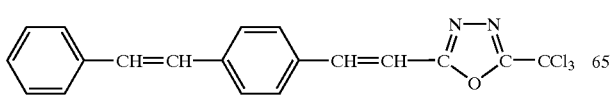 (PAG1-8)

-continued

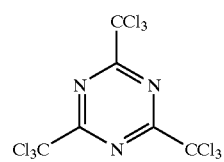 (PAG2-1)

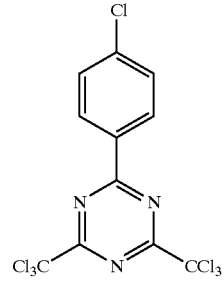 (PAG2-2)

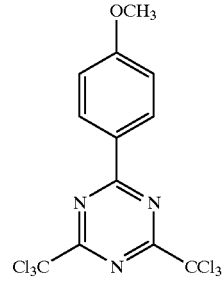 (PAG2-3)

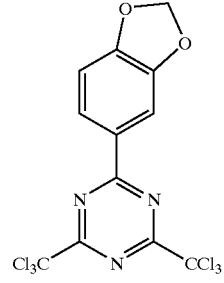 (PAG2-4)

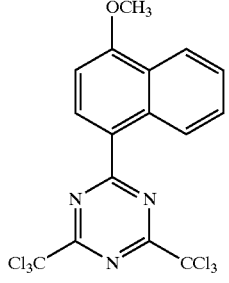 (PAG2-5)

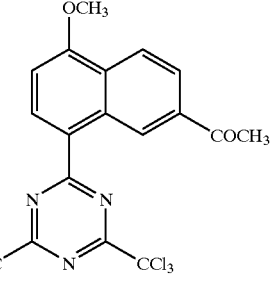 (PAG2-6)

(PAG2-7)

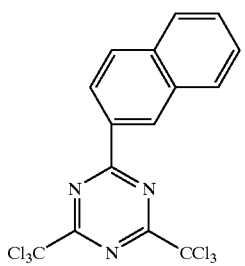

(PAG2-8)

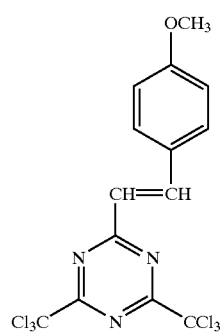

(PAG2-9)

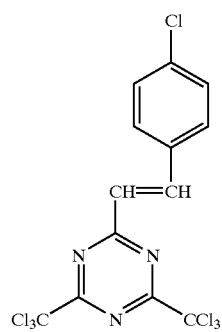

(PAG2-10)

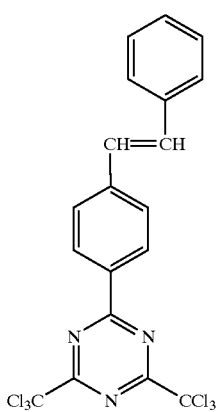

(2) Disulfone derivative represented by the following general formula (PAG5) or iminosulfonate derivative represented by the following general formula (PAG6)

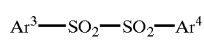
(PAG5)

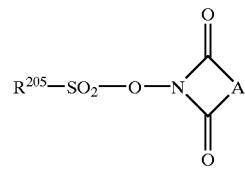
(PAG6)

wherein $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene or arylene group.

Specific examples of these compounds will be given below, but the present invention should not be construed as being limited thereto.

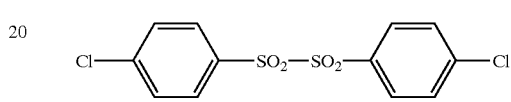
(PAG5-1)

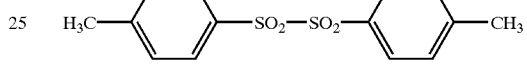
(PAG5-2)

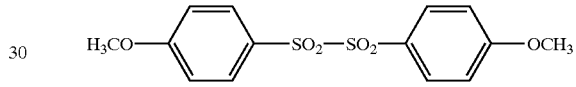
(PAG5-3)

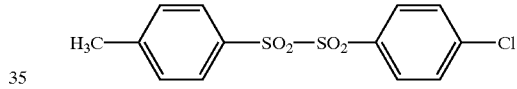
(PAG5-4)

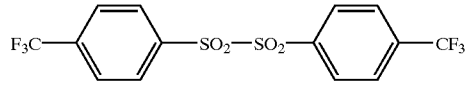
(PAG5-5)

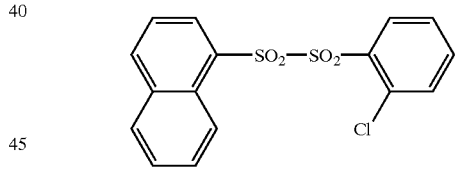
(PAG5-6)

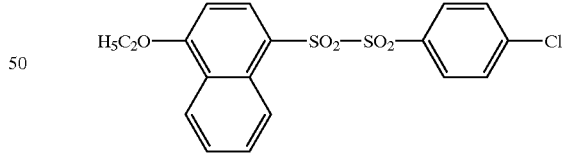
(PAG5-7)

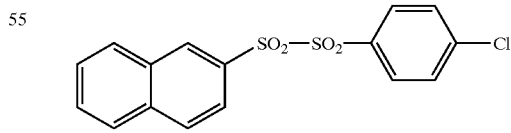
(PAG5-8)

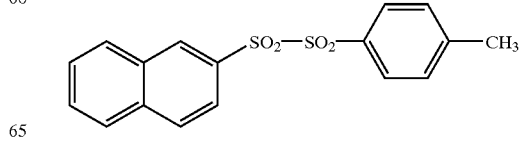
(PAG5-9)

(PAG5-10)
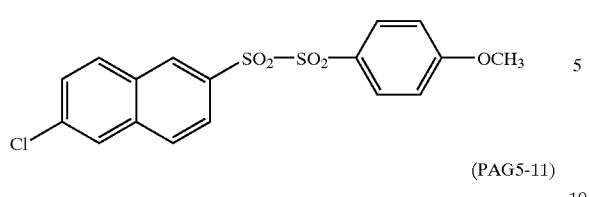
(PAG5-11)
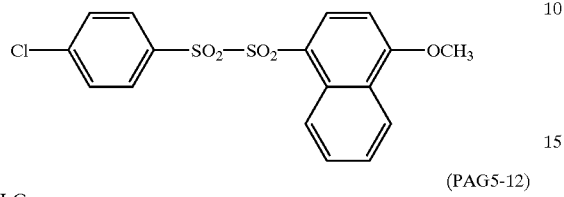
(PAG5-12)
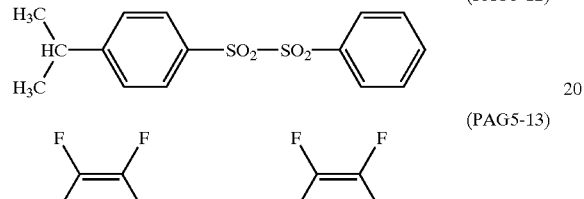
(PAG5-13)
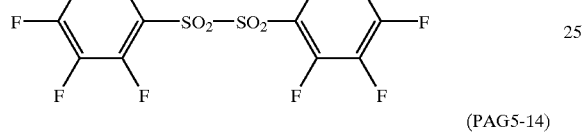
(PAG5-14)
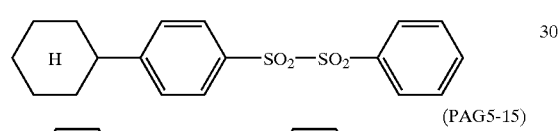
(PAG5-15)
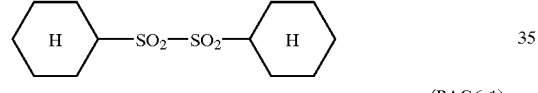
(PAG6-1)
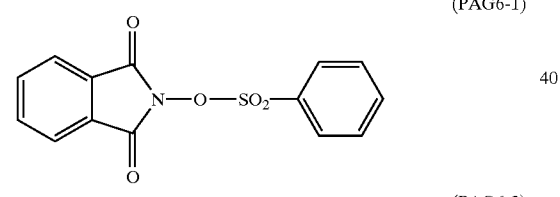
(PAG6-2)
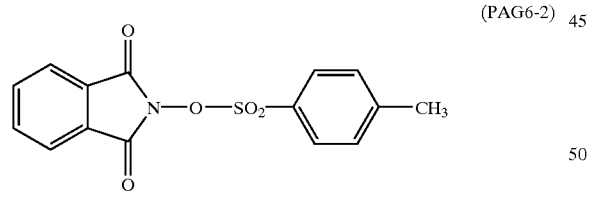
(PAG6-3)
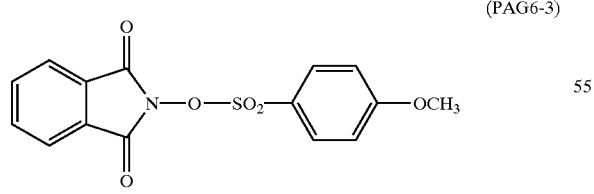
(PAG6-4)
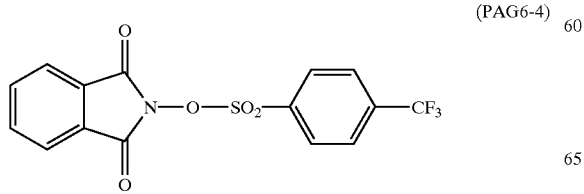
(PAG6-5)
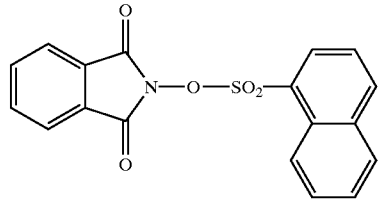
(PAG6-6)
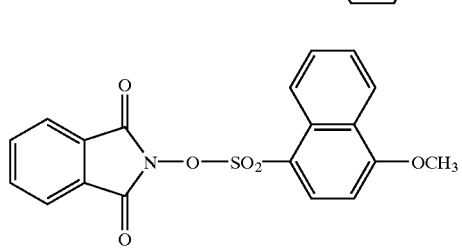
(PAG6-7)
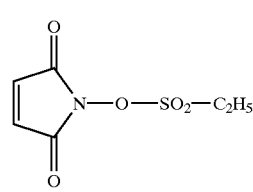
(PAG6-8)
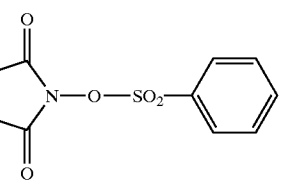
(PAG6-9)
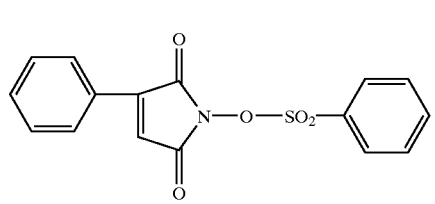
(PAG6-10)
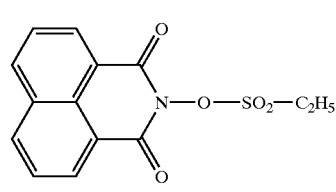
(PAG6-11)
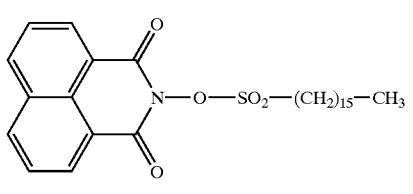
(PAG6-12)
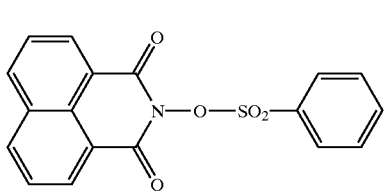

-continued (PAG6-13)

(PAG6-14)

(PAG6-15)

(PAG6-16)

(PAG6-17)

(PAG6-18)

(PAG6-19)

(3) Diazodisulfone derivative compound represented by the following general formula (PAG7)

$$R^{21}-SO_2-\overset{N_2}{\underset{\parallel}{C}}-SO_2-R^{22}$$

wherein $R^{21}$ and $R^{22}$ each independently represents an alkyl group which may have a substituent, cycloalkyl group or aryl group which may have a substituent.

The alkyl group represented by $R^{21}$ or $R^{22}$ is preferably a $C_{1-20}$ straight-chain or branched alkyl group, more preferably a $C_{1-12}$ straight-chain or branched alkyl group. The cycloalkyl group represented by $R^{21}$ or $R^{22}$ is preferably a cyclopentyl group or cyclohexyl group. The aryl group represented by $R^{21}$ or $R^{22}$ is preferably a $C^{6-10}$ aryl group which may have substituents. Examples of the substituents include alkyl group such as methyl group, ethyl group, n-propyl group, i-propyl group, n-butyl group, i-butyl group, s-butyl group, t-butyl group, n-pentyl group, n-hexyl group, n-octyl group, 2-ethylhexyl group, nonyl group, decyl group and dodecyl group, alkoxy group such as methoxy group, ethoxy group, propoxy group and butoxy group, halogen atom, nitro group, and acetyl group.

Specific examples of the diazodisulfone derivative compound include the following compounds.

Bis(methylsulfonyl)diazomethane, bis(ethylsulfonyl) diazomethane, bis(propylsulfonyl)diazomethane, bis(1-methylpropylsulfonyl)diazomethane, bis(butylsulfonyl) diazomethane, bis(1-methylbutylsulfonyl)diazomethane, bis (heptylsulfonyl)diazomethane, bis(octylsulfonyl) diazomethane, bis(nonylsulfonyl)diazomethane, bis (decylsulfonyl)diazomethane, bis(dodecylsulfonyl) diazomethane, bis(cyclohexylsulfonyl)diazomethane, bis (benzylsulfonyl)diazomethane, bis(2-chlorobenzylsulfonyl) diazomethane, bis(4-chlorobenzylsulfonyl)diazomethane, bis(2-methylphenylsulfonyl)diazomethane, bis(3-methylsulfonyl)diazomethane, bis(4-methylphenylsulfonyl) diazomethane, bis(2,4-dimethylphenylsulfonyl) diazomethane, bis(2,5-dimethylphenylsulfonyl) diazomethane, bis(3,4-dimethylphenylsulfonyl) diazomethane, bis(2,4,6-trimethylphenylsulfonyl) diazomethane, bis(4-fluorophenylsulfonyl)diazomethane, bis(2,4-difluorophenylsulfonyl)diazomethane, bis(2,4,6-trifluorophenylsulfonyl)diazomethane, bis(4-nitrophenylsulfonyl)diazomethane (4) Diazoketosulfone derivative compound represented by the following general formula (PAG8)

$$R^{21}-CO-\overset{N_2}{\underset{\parallel}{C}}-SO_2-R^{22}$$

wherein $R^{21}$ and $R^{22}$ are as defined in the general formula PAG7.

Specific examples of the diazoketosulfone derivative compound include the following compounds.

Methylsulfonyl-benzoyl-diazomethane, ethylsulfonyl-benzoyl-diazomethane, methylsulfonyl-4-bromobenzoyl-diazomethane, ethylsulfonyl-4-bromobenzoyl-diazomethane, phenylsulfonyl-benzoyl-diazomethane, phenylsulfonyl-2-methylphenyl-diazomethane, phenylsulfonyl-3-methylphenyl-diazomethane, phenylsulfonyl-4-methylphenyl-diazomethane, phenylsulfonyl-3-methoxyphenyl-diazomethane, phenylsulfonyl-4-methoxyphenyl-diazomethane, phenylsulfonyl-3-chlorobenzoyl-diazomethane, phenylsulfonyl-4-chlorophenyl-diazomethane, tolylsulfonyl-3-chlorobenzoyl-diazomethane, tolylsulfonyl-4-chlorophenyl-diazomethane, phenylsulfonyl-4-fluorophenyl-diazomethane, tolylsulfonyl-4-fluorophenyl-diazomethane Preferred among these compounds are compounds which generate an organic sulfonic acid when irradiated with active ray or radiation. The term "organic sulfonic acid" as used herein is meant to indicate a sulfonic acid having an organic group. Examples of the organic group include alkyl group which may have a substituent, phenyl group which may have a substituent, and naphthyl group which may have a substituent. Examples of the substituents include $C_{1-12}$ straight-chain or branched alkyl group, $C_{1-6}$ alkoxy group, and halogen atom such as fluorine, chlorine, bromine and iodine. Specific examples of the organic groups include alkyl group such as methyl group, ethyl group, n-propyl group, i-propyl group, n-butyl group, i-butyl group, t-butyl group, n-amyl group, i-amyl group, t-amyl group, s-amyl group, n-hexyl group, n-pentyl group, n-octyl group, 2-ethylhexyl group, nonyl group, decyl group and dodecyl group, substituted alkyl group such as chloromethyl group, dichloromethyl group, trichloromethyl group, chloroethyl group, fluoromethyl group, difluoromethyl group, trifluoromethyl group, perfluorobutyl group and perfluorooctyl group, phenyl group, substituted phenyl group such as tosyl group, dimethylphenyl group, trimethylphenyl group, methoxyphenyl group, ethoxyphenyl group, chlorophenyl group, bromophenyl group, iodophenyl group, fluorophenyl group and pentafluorophenyl group, naphthyl group, and substituted naphthyl group such as methylnaphthyl group, methoxynaphthyl group, chlorophenyl group, bromonaphthyl group and iodonaphthyl group. Particularly preferred among these organic groups are fluorine atom-containing groups.

The compound represented by the general formula [sI] or [sII] can be synthesized by subjecting the corresponding Cl$^-$ salt (compound obtained by replacing X$^-$ in the general formula [sI] or [sII] by Cl$^-$) and the compound represented by X$^-$Y$^+$ (in which X$^-$ is as defined in the general formula [sI] or [sII], and Y$^+$ represents a cation such as H$^+$, Na$^+$, K$^+$, NH$_4^+$ and N(CH$_3$)$_4^+$) to salt exchange in an aqueous solution. Besides the foregoing chloride, hydroxide or methanesulfonate can be subjected to similar salt exchange.

The content of the photo-acid generator (particularly photo-acid generator represented by the general formula [sI] or [sII]) as component (B') in the photoresist composition is preferably from 0.01 to 20% by weight, more preferably from 0.05 to 15% by weight, even more preferably from 0.1 to 10% by weight based on the total solid content in the positive-working photoresist composition. When the content of the photo-acid generator falls below 0.01% by weight, the resulting photoresist composition exhibits a lowered sensitivity. On the contrary, when the content of the photo-acid generator exceeds 20% by weight, the resulting photoresist composition exhibits excessive optical absorption that causes deterioration of sensitivity, profile and resolution.

The added amount of the photo-acid generator to be used in combination with the other components is normally 80% by weight or less, preferably 70% by weight or less, more preferably 60% by weight or less based on the total amount of photo-acid generators in the positive-working photoresist composition.

The compound which generates an acid when irradiated with active ray or radiation (B) will be described hereinafter.

As the compound which decomposes to generate an acid when irradiated with active ray or radiation (B) there may be used, besides the foregoing compound, one properly selected from the group consisting of cationic photopolymerization initiator, radical photopolymerization initiator, optical decolorizer for dyes, optical discolorizer, compound which generates an acid when irradiated with known light for use in the formation of microresist, etc. (e.g., ultraviolet ray having a wavelength of from 200 nm to 400 nm, far ultraviolet ray, particularly g-line, i-line, KrF excimer laser beam, ArF excimer laser beam, electronic ray, X ray, molecular ray, ion beam), and mixture thereof.

In some detail, any of the compounds exemplified as a photo-acid generator to be used in the onium salt compound which generates an acid when irradiated with active ray or radiation (B') can be used as the component (B), not to mention the onium salt compound.

Examples of the compound which can be particularly effectively used as the component (B) include (1) oxazole derivative represented by the foregoing general formula (PAG1) or S-triazine derivative represented by the foregoing general formula (PAG2) substituted by trihalomethyl group, (2) iodonium salt represented by the foregoing general formula (PAG3) or sulfonium salt represented by the foregoing general formula (PAG4), (3) disulfone derivative represented by the foregoing general formula (PAG5) or iminosulfonate derivative represented by the foregoing general formula (PAG6), (4) diazodisulfone derivative compound represented by the foregoing general formula (PAG7), and (5) diazoketosulfone derivative compound represented by the foregoing general formula (PAG8).

In the present invention, as the photo-acid generator (B) there is used an onium salt. Particularly preferred among these onium salt compounds are sulfonium salt compound and iodonium salt compound. Specific examples of these salt compounds include those represented by the foregoing general formulae (PAG-3) and (PAG-4).

Preferred among the compounds represented by the foregoing general formulae (PAG-3) and (PAG-4) are those having as substituents on the phenyl group in the cationic moiety thereof an alkyl group having 5 or more carbon atoms which may have a substituent, cycloalkyl group having 5 or more carbon atoms which may have a substituent, alkoxy group having 5 or more carbon atoms which may have a substituent, acyl group having 5 or more carbon atoms which may have a substituent or acyloxy group having 5 or more carbon atoms which may have a substituent. A particularly preferred example of such a compound is a photo-acid generator represented by the foregoing general formula [sI] or [sII]. In this arrangement, the number of particles in the resist composition solution and the number of particles increased in the resist solution after aging storage can be lessened.

The added amount of the photo-acid generator (B) is normally from 0.001 to 40% by weight, preferably from 0.01 to 20% by weight, more preferably from 0.1 to 5% by weight based on the total weight of the positive-working photoresist composition of the invention (excluding the coating solvent). When the added amount of the compound which generates an acid when irradiated with active ray or radiation falls below 0.001% by weight, the resulting photoresist composition exhibits a lowered sensitivity. On the contrary, when the added amount of the compound which generates an acid when irradiated with active ray or radiation exceeds 40% by weight, the resulting resist exhibits too high a light absorptivity that worsens profile or narrows the process (particularly bake) margin to disadvantage.

The positive-working photoresist composition of the invention preferably further comprises a surface active agent incorporated therein. In this arrangement, the resulting photoresist composition exhibits an excellent dependence on density. In some detail, the positive-working photoresist composition of the invention preferably comprises at least one surface active agent selected from the group consisting of fluorine-based surface active agent, silicon-based surface active agent, surface active agent containing both fluorine atom and silicon atom and nonionic surface active agent incorporated therein. Particularly preferred among these surface active agents are fluorine-based surface active agent, silicon-based surface active agent and surface active agent containing both fluorine atom and silicon atom.

Examples of these surface active agents include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The following commercially available surface active agents may be used as they are.

Examples of commercially available surface active agents employable herein include fluorine-based surface active agents such as EFTOP EF301, EF303 (produced by Tohkem Products Corp.), Florad FC430, 431 (produced by Sumitomo 3M Limited), Megafac F171, F173, F176, F189, R08 (produced by DAINIPPON INK & CHEMICALS, INC.) and Surflon S-382, SC101, 102, 103, 104, 105, 106 (produced by Asahi Glass Co., Ltd.). Further, Polysiloxane polymer KP-341 (produced by Shin-Etsu Chemical Co., Ltd.) may be used as a silicon-based surface active agent. Specific other examples of surface active agent employable herein include nonionic surface active agents such as polyoxyethylene alkyl allyl ether (e.g., polyoxyethylene lauryl ether, polyoxyethylene stearyl ether, polyoxyethylene cetyl ether, polyoxyethylene oleyl ether), polyoxyethylene alkyl allyl ether (e.g., polyoxyethylene octyl phenol ether, polyoxyethylene nonyl phenol ether), polyoxyethylene-polyoxypropylene block copolymer, sorbitan fatty acid ester (e.g., sorbitan monolaurate, sorbitan monopalmitate, sorbitan monostearate, sorbitan monooleate, sorbitan trioleate, sorbitan tristearate) and polyoxyethylene sorbitan fatty acid ester (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

The amount of the surface active agent to be incorporated in the photoresist composition is normally from 0.001% to 2% by weight, preferably from 0.01% to 1% by weight based on the solid content in the composition of the invention.

These surface active agents may be added singly or in combination.

The positive-working photoresist composition of the invention preferably further comprises an organic basic compound incorporated therein. In this arrangement, the change of sensitivity with time can be lessened.

Examples of the organic basic compound employable herein include those having the following structures.

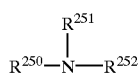
(A)

wherein $R^{250}$, $R^{251}$ and $R^{252}$ may be the same or different and each represents a hydrogen atom, $C_{1-6}$ alkyl group, $C_{1-6}$ aminoalkyl group, $C_{1-6}$ hydroxyalkyl group or $C_{6-20}$ substituted or unsubstituted aryl group; and $R^{251}$ and $R^{252}$ may be connected to each other to form a ring.

(B)

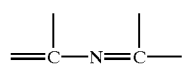
(C)

(D)

-continued

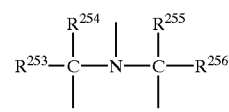
(E)

wherein $R^{253}$, $R^{254}$, $R^{255}$ and $R^{256}$ may be the same or different and each represents a $C_{1-6}$ alkyl group.

An even more desirable compound is a nitrogen-containing basic compound having two or more nitrogen atoms having different chemical environments per molecule, particularly a compound or alkylamino group having both substituted or unsubstituted amino group and nitrogen-containing cyclic structure. Specific examples of such a compound include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperadine, substituted or unsubstituted aminomorpholine, and substituted or unsubstituted aminoalkylmorpholine. Preferred examples of substituents on these compounds include amino group, aminoalkyl group, alkylamino group, aminoaryl group, arylamino group, alkyl group, alkoxy group, acyl group, acyloxy group, aryl group, aryloxy group, nitro group, hydroxyl group, and cyano group.

Specific preferred examples of the nitrogen-containing basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpridine, 3-aminopyrrolidine, piperadine, N-(2-aminoethyl)piperadine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, 2-pyrazoline, 3-pyrazoline, N-aminomorpholine, N-(2-aminoethyl)morpholine, 1,5-diazabicyclo[4.3.o]nona-5-ene, 1,8-diazabicyclo[5.4.0]undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, tertiary morpholine derivatives such as cyclohexylmorpholinoethyl thiourea (CHMETU), and hindered amines (e.g., [0005]) disclosed in JP-A-11-52575.

Particularly preferred among these nitrogen-containing basic compounds are 1,5-diazabicyclo[4.3.0]-5-nonene, 1,8-diazabicyclo[5.4.0]-7-undecene (DBU), 1,4-diazabicyclo[2.2.2]octane, 4-dimethylaminopyridine, hexamethylenetetramine, 4,4-dimethylimidazoline, pyrroles, pyrazoles, imidazoles, pyridazines, tertiary morpholine derivatives such as CHMETU, and hindered amines such as bis(1,2,2,6,6-pentamethyl-4-piperidyl)sebacate.

Preferred among these nitrogen-containing basic compounds are 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, (CHMETU), and bis(1,2,2,6,6-pentamethyl-4-piperidyl)sebacate.

These organic basic compounds may be used singly or in combination of two or more thereof. The amount of the organic basic compound to be used is normally from 0.001% to 10% by weight, preferably from 0.01% to 5% by weight based on the total solid content in the photosensitive resin composition When the amount of the organic basic compound to be used falls below 0.001% by weight, the effect of the organic basic compound cannot be exerted. On the contrary, when the amount of the organic basic compound to be used exceeds 10% by weight, the resulting resin composition can be liable to the lowering of sensitivity and the deterioration of developability on unexposed areas.

The positive-working photoresist composition of the invention can comprise a solvent for dissolving the foregoing components (A) and (B') therein. Examples of the solvent employable herein include propylene glycol monoalkyl ether acetates such as propylene glycol monomethyl ether acetate and propylene glycol monoethyl ether acetate, lactic acid alkylesters such as methyl lactate and ethyl lactate, propylene glycol monoalkyl ethers such as propylene glycol monomethyl ether and propylene glycol monoethyl ether, ethylene glycol monoalkyl ethers such as ethylene glycol monomethyl ether and ethylene glycol monoethyl ether, ethylene glycol monomethyl ether acetate and ethylene glycol monoethyl ether acetate, alkoxypropionic acid alkyls such as 2-heptanone, γ-butyrolactone, methyl methoxypropionate and ethyl ethoxypropionate, pyruvic acid alkylesters such as methyl pyruvate and ethyl pyruvate, N-methylpyrrolidone, N,N-dimethyl acetamide, and dimethyl sulfoxide. At least one solvent selected from these solvents can be used in coating.

In the case where the positive-working photoresist composition of the invention comprises the foregoing components (A) and (B) incorporated therein, it preferably comprises a specific mixed solvent (C) for dissolving these components therein.

As the component (C) there may be used a mixed solvent containing at least one of propylene glycol monoalkyl ether carboxylates (also referred to as "solvent belonging to the group a"), at least one of propylene glycol monoalkyl ether, lactic acid alkyl and alkoxy alkyl propionate (also referred to as "solvent belonging to the group b") and/or γ-butyrolactone, ethylene carbonate and propylene carbonate (also referred to as "solvent belonging to the group c"). In some detail, as the component (C) there may be used a combination of a solvent belonging to the group a and a solvent belonging to the group b, a combination of a solvent belonging to the group a and a solvent belonging to the group c or a combination of a solvent belonging to the group a, a solvent belonging to the group b and a solvent belonging to the group c. When the combination of a solvent belonging to the group a and a solvent belonging to the group b is used, the resulting photoresist composition is excellent particularly in edge roughness resistance. When the combination of a solvent belonging to the group a and a solvent belonging to the group c is used, the resulting resist solution is excellent particularly in age stability. When the combination of a solvent belonging to the group a, a solvent belonging to the group b and a solvent belonging to the group c is used, the resulting photoresist composition is excellent in both edge roughness resistance and age stability of resist solution in particular.

Preferred examples of the propylene glycol monoalkyl ether carboxylate include propylene glycol monomethyl ether acetate, propylene glycol monomethyl ether propionate, propylene glycol monoethyl ether acetate, and propylene glycol monoethyl ether propionate.

Preferred examples of the propylene glycol monoalkyl ether include propylene glycol monomethyl ether, and propylene glycol monoethyl ether. Preferred examples of the lactic acid alkyl include methyl lactate, and ethyl lactate. Preferred examples of the alkoxy alkyl propionate include 3-ethoxyethyl propionate, 3-methoxymethyl propionate, 3-methoxyethyl propionate, and 3-ethoxymethyl propionate.

The mixing weight ratio (a:b) of the solvent belonging to the group a and the solvent belonging to the group b is preferably from 90:10 to 15:85, more preferably from 80:20 to 20:80, even more preferably from 70:30 to 25:75.

The mixing weight ratio (a:c) of the solvent belonging to the group a and the solvent belonging to the group c is preferably from 99.9:0.1 to 75:25, more preferably from 99:1 to 80:20, even more preferably from 97:3 to 85:15.

In the case where the three kinds of solvents are used, the mixing weight ratio of the solvent belonging to the group c is preferably from 0.1% to 25% by weight, more preferably from 1% to 20% by weight, even more preferably from 3% to 17% by weight based on the total weight of solvents.

In the present invention, the solid content of the resist composition comprising the foregoing various components is preferably dissolved in the foregoing mixed solvent in a solid concentration of from 3% to 25% by weight, more preferably from 5% to 22% by weight, even more preferably from 7% to 20% by weight.

Preferred examples of combination of solvents to be mixed as component (C) will be given below.

Propylene glycol monomethyl ether acetate+propylene glycol monomethyl ether

Propylene glycol monomethyl ether acetate+ethyl lactate

Propylene glycol monomethyl ether acetate+3-ethoxyethyl propionate

Propylene glycol monomethyl ether acetate+γ-butyrolactone

Propylene glycol monomethyl ether acetate+ethylene carbonate

Propylene glycol monomethyl ether acetate+propylene carbonate

Propylene glycol monomethyl ether acetate+propylene glycol monomethyl ether+γ-butyrolactone Propylene glycol monomethyl ether acetate+ethyl lactate+γ-butyrolactone Propylene glycol monomethyl ether acetate+3-ethoxyethyl propionate+γ-butyrolactone Propylene glycol monomethyl ether acetate+propylene glycol monomethyl ether+ethylene carbonate Propylene glycol monomethyl ether acetate+ethyl lactate+ethylene carbonate Propylene glycol monomethyl ether acetate+3-ethoxyethyl propionate+ethylene carbonate Propylene glycol monomethyl ether acetate+propylene glycol monomethyl ether+propylene carbonate Propylene glycol monomethyl ether acetate+ethyl lactate+propylene carbonate Propylene glycol monomethyl ether acetate+3-ethoxyethyl propionate+propylene carbonate Particularly preferred among the foregoing combinations are as follows:

Propylene glycol monomethyl ether acetate+propylene glycol monomethyl ether+γ-butyrolactone Propylene glycol monomethyl ether acetate+ethyl lactate+γ-butyrolactone Propylene glycol monomethyl ether acetate+3-ethoxyethyl propionate+γ-butyrolactone Propylene glycol monomethyl ether acetate+propylene glycol monomethyl ether+ethylene carbonate Propylene glycol monomethyl ether acetate+ethyl lactate+ethylene carbonate Propylene glycol monomethyl ether acetate+3-ethoxyethyl propionate+ethylene carbonate Propylene glycol monomethyl ether acetate+propylene glycol monomethyl ether+propylene carbonate Propylene glycol monomethyl ether acetate+ethyl lactate+propylene carbonate Propylene glycol monomethyl ether acetate+3-ethoxyethyl propionate+propylene carbonate These specific mixed solvents may contain other solvents than the above specified solvents, but such other solvents are generally contained in an amount of not more than 30% by weight. Examples of the other solvents which may contain include ethylene glycol monoalkyl ethers such as ethylene glycol monomethyl ether and ethylene glycol monoethyl ether, ethylene glycol monoalkyl ether acetate such as ethylene glycol monomethyl ether acetate and ethylene glycol monoethyl ether acetate, alkoxypropionic acid alkyls such as 2-heptanone, methyl methoxypropionate and ethyl ethoxypropionate, N-methylpyrrolidone, N,N-dimethyl acetamide, and dimethyl sulfoxide.

The positive-working photoresist composition of the invention may further comprise an acid-decomposable dissolution-inhibiting compound, a dye, a plasticizer, a surface active agent other than described above, an optical sensitizer, an organic basic compound, a compound for accelerating solubility in the developer incorporated therein as necessary.

The positive-working resist composition of the invention is applied to a substrate to form a thin film thereon. The thickness of the coating film is preferably from 50 nm to 1,500 nm.

The foregoing composition is applied to a substrate as used in the production of precision integrated circuit elements (e.g., silicon/silicon dioxide-coated substrate) by a proper coating means such as spinner and coater. The coated material is exposed to light through a predetermined mask, and then baked to undergo development to obtain a good resist pattern. As the exposing light there is preferably used light having a wavelength range of 250 nm or less, more preferably 220 nm or less. Specific examples of such light include KrF excimer laser (248 nm), ArF excimer laser (193 nm), $F_2$ excimer laser (157 nm), X-ray, and electron beam. Particularly preferred among these light beams is ArF excimer laser (193 nm).

As the developer for positive-working photoresist composition for exposure to far ultraviolet ray of the invention there may be used an alkaline aqueous solution of inorganic alkali such as sodium hydroxide, potassium hydroxide, sodium carbonate, sodium silicate, sodium metasilicate and aqueous ammonia, primary amine such as ethylamine and n-propylamine, secondary amine such as diethylamine and di-n-butylamine, tertiary amine such as triethylamine and methyl diethylamine, alcoholamine such as dimethyl ethanolamine, triethanolamine, quaternary ammonium salt such as tetramethyl ammonium hydroxide and tetraethyl ammonium hydroxide or cyclic amine such as pyrrole and piperidine.

The foregoing alkaline aqueous solution may further comprise an alcohol or surface active agent incorporated therein in a proper amount.

In the case where the positive-working photoresist composition is used as upper layer resist in a two-layer resist, the lower layer organic polymer film is etched by oxygen plasma with the upper resist patter as a protective mask. The upper resist has a sufficient resistance to oxygen plasma. The oxygen plasma resistance of the positive-working photoresist composition of the invention depends on the silicon content of the upper resist, the etching apparatus and the etching conditions. However, the etching selection ratio (ratio of etching rate of lower layer to upper layer) can be predetermined to a range as large as 10 to 100.

The process for the formation of pattern by the positive-working photoresist composition of the invention begins with the formation of an organic polymer film on the substrate to be worked. The organic polymer film may be made of any known photoresist. Examples of such a photoresist include FH Series, FHi Series produced by Fuji Film Olin Co., Ltd., OiR Series produced by Olin Co., Ltd., and PFI Series produced by SUMITOMO CHEMICAL CO., LTD. The formation of the organic polymer film is accomplished by dissolving such a photoresist in a proper solvent, and then applying the solution thus obtained to the substrate by spin coating method, spray coating method or the like. Subsequently, a film of the positive-working photoresist composition of the invention is formed on the first layer in the organic polymer film. The formation of the film of positive-working photoresist composition is accomplished by dissolving the resist material in a proper solvent, and then applying the solution thus obtained to the substrate by spin coating method, spray coating method or the like as in the first layer.

The second layer resist thus obtained is then subjected to pattern formation. In the first stage of the pattern formation step, the second layer, i.e., the upper photoresist composition layer is subjected to pattern formation. If necessary, mask registration is effected. By irradiating the substrate with a high energy light beam through the mask, the photoresist composition is rendered soluble in an alkaline aqueous solution at the irradiated areas. The substrate thus irradiated is then developed with an alkaline aqueous solution to form a pattern thereon.

Subsequently, in the second stage, the organic polymer layer is etched. This operation involves oxygen plasma etching with the pattern of resist composition layer as a mask. Thus, a fine pattern having a high aspect ratio is formed. The etching of the organic polymer layer by oxygen plasma etching involves the same technique as plasma ashing used to peel the resist layer after the termination of the etching of the substrate by conventional photoetching. This operation can be carried out using, e.g., cylindrical plasma etching apparatus or parallel flat plate plasma etching apparatus with oxygen as an etching gas.

With this resist pattern as a mask, the substrate is then worked. As the working method there may be used a dry etching method such as sputtering, gas plasma etching and ion beam etching.

The etching process involving a two-layer resist method using a resist layer of the invention ends with the peeling of the resist layer. The peeling of the resist layer can be accomplished merely by dissolving the first layer organic polymer material. Since the organic polymer material is made of an arbitrary photoresist and undergoes no denaturation (hardening, etc.) at the foregoing photoetching step, any organic solvent suitable for the photoresist itself can be used. Alternatively, the organic polymer material can be subjected to plasma etching so that it can be peeled in the absence of solvent.

EXAMPLES

The present invention will be further described in the following examples, but the present invention should not be construed as being limited thereto.

Synthesis Example 1

Synthesis of Photo-acid Generator [sI-3]

60 g of t-amylbenzene, 39.5 g of potassium iodate, 81 g of acetic anhydride and 170 ml of dichloromethane were mixed. To the mixture was then added dropwise 66.8 g of concentrated sulfuric acid while being cooled over an ice bath in 2 hours. The reaction solution was stirred as it was for 2 hours and then at room temperature overnight to terminate the reaction.

After the termination of the reaction, to the reaction solution was then added dropwise 50 ml of distilled water while being cooled over an ice bath to cause extraction. The resulting organic phase was washed with water, aqueous baking soda and water, and then concentrated to obtain 40 g of di(t-amylphenyl)iodonium sulfate.

The resulting sulfate and potassium heptadecafluoroocanesulfonate were then subjected to salt exchange reaction to obtain [sI-3] as desired material.

Synthesis Example 2

Synthesis of Photo-acid Generator [sI-6]

90 g of n-octylphenylether, 39.5 g of potassium iodate, 81 g of acetic anhydride and 180 ml of dichloromethane were mixed. To the mixture was then added dropwise 66.8 g of concentrated sulfuric acid while being cooled over an ice bath in 2 hours. The reaction solution was stirred as it was for 2 hours and then at room temperature overnight to terminate the reaction.

After the termination of the reaction, to the reaction solution was then added dropwise 50 ml of distilled water while being cooled over an ice bath to cause extraction. The resulting organic phase was washed with water, aqueous baking so da and water, and then concentrated to obtain 45 g of di(n-octyloxyphenyl)iodonium sulfate.

The resulting sulfate and potassium heptadecafluoroocanesulfonate were then subjected to salt exchange reaction to obtain [sI-6] as desired material.

Synthesis Example 3

Synthesis of Photo-acid Generator [sI-9]

Di(t-amylphenyl)iodonium sulfate obtained in Synthesis Example 1 and sodium pentafluorobenzenesulfonate were subjected to salt exchange reaction to synthesize [sI-9] as desired material.

Synthesis Example 4

Synthesis of Photo-acid Generator [sI-5]

To 40 g of iodobenzene was slowly added dropwise 91 g of peracetic acid. The reaction solution was then stirred at a temperature of 30° C. for 2 hours. When a white powder was precipitated, the reaction solution was then cooled with ice. The resulting precipitate was withdrawn by filtration to recover 38 g of idosobenzene diacetate.

50 g of idosobenzene diacetate thus obtained, 30 g of octylphenyl ether, 70 g of acetic anhydride and 725 ml of glacial acetic acid were mixed. To the mixture was then added dropwise 8 g of concentrated sulfuric acid while being cooled over an ice bath in 1 hour. After 1 hour, to the reaction solution was added dropwise an aqueous solution of 31 g of NaBr in 150 ml of water. 42 g of iodonium bromide was then recovered in the form of white powder.

The iodonium bromide thus obtained and a trifluoromethanesulfonate were then subjected to salt exchange reaction to obtain [sI-5] as desired material.

Synthesis Example 5

Synthesis of Photo-acid Generator [sII-3]

50 g of diphenyl sulfoxide was dissolved in 800 ml of mesitylene. To the solution was then added 200 g of aluminum chloride. The mixture was then stirred at a temperature of 80° C. for 24 hours. After the termination of the reaction, the reaction solution was slowly poured into 2 liter of ice. To the reaction solution was then added 400 ml of concentrated hydrochloric acid. The reaction mixture was then heated to a temperature of 70° C. for 10 minutes. The reaction solution was allowed to cool to room temperature, washed with ethyl acetate, and the filtered. To the filtrate was then added a solution of 200 g of ammonium iodide in 400 ml of distilled water to cause precipitation. The resulting powder was withdrawn by filtration, washed with water and ethyl acetate, and then dried to obtain 72 g of sulfonium iodide.

50 g of sulfonium iodide thus obtained was then dissolved in 300 ml of methanol. To the solution thus obtained was then added 31 g of silver oxide. The reaction mixture was stirred for 4 hours. The reaction solution was filtered. The resulting product was then subjected to salt exchange with potassium heptadecafluorooctanesulfonate to recover 40 g of [sII-3] as desired material.

Synthesis Example 6

Synthesis of Photo-acid Generator [sII-2]

The procedure of Synthesis Example 5 was followed except that octylbenzene was used instead of mesitylene to synthesize the corresponding sulfonium iodide. Sulfonium iodide thus obtained was then subjected to salt exchange with potassium trifluoromethansulfonate in the same manner as in Synthesis Example 5 to synthesize [sII-2].

Synthesis Example 7

Synthesis of Photo-acid Generator [sII-8]

The procedure of Synthesis Example 5 was followed except that octyloxybenzene was used instead of mesitylene to synthesize the corresponding sulfonium iodide. Sulfonium iodide thus obtained was then subjected to salt exchange with potassium nonafluorobutansulfonate in the same manner as in Synthesis Example 5 to synthesize [sII-8].

Synthesis Example 8

Synthesis of Photo-acid Generator [sII-14]

To 50 g of diphenyl sufoxide and 45 g of 2,6-xylenol was added 100 ml of a (10/1) solution of diphosphorus pentaoxide in methanesulfonic acid. After the termination of heat generation, the reaction solution was heated to a temperature of 50° C. for 4 hours. After the termination of the reaction, the reaction solution was then poured into ice. The aqueous solution was washed with toluene, and then filtered. To the reaction solution was then added an aqueous solution obtained by dissolving 200 g of ammonium iodide in 400 ml of distilled water to cause precipitation. The resulting powder thus precipitated was filtered off. The powder thus obtained was washed with water, and then dried to obtain sulfonium iodide.

50 g of sulfonium iodide thus obtained was then dissolved in 300 ml of methanol. To the solution was then added 31 g of silver oxide. The reaction mixture was then stirred for 4 hours. The reaction solution was filtered, and then subjected to salt exchange with potassium heptadecafluorooctane-sulfonate to recover 43 g of [sII-14] as desired material.

[Synthesis of Resin]

Synthesis Example (1)

Synthesis of Resin (1-1)

11.4 g of trimethylallylsilane, 6.8 g of maleic anhydride and 12.8 g of di-t-amylfumarate were added to 34 g of dried THF. The mixture was then heated to a temperature of 65° C. in a stream of nitrogen. When the reaction temperature was stabilized, a Type V-65 initiator produced by Wako Pure Chemical Industries, Ltd. was then added in an amount of 10 mol-% based on the total molar amount of the monomers to initiate reaction. After 6 hours of reaction, the reaction mixture was diluted twice with THF, and then poured into a large amount of hexane to cause precipitation of white powder. Subsequently, in order to reduce the amount of residual monomer and low molecular weight components, the powder thus precipitated was dissolved in acetone. To the solution was then added hexane by small portions to cause precipitation of polymer. The precipitate thus obtained was then dried under reduced pressure to obtain a resin (1-1).

The resin (1-1) thus obtained was then measured for molecular weight by GPC. The results were 7,600 as calculated in terms of weight-average molecular weight with polystyrene as a standard sample. The content of components having a molecular weight of 1,000 or less was 2% as calculated in terms of area ratio on GPC.

Synthesis Example (2)

Synthesis of Resins (1-2) to (1-9)

Resins (1-2) to (1-9) were then obtained in the same manner as in Synthesis Example (1).

The molar ratio of various repeating units constituting the resins (1-1) to (1-9) and the structural formulae of these resins are shown below.

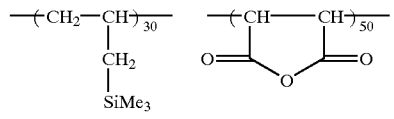

(Resin 1-1)

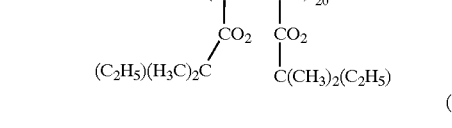

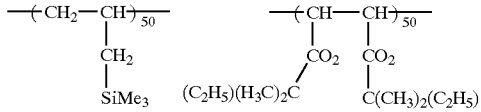

(Resin 1-2)

-continued

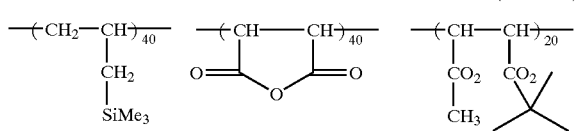

(Resin 1-3)

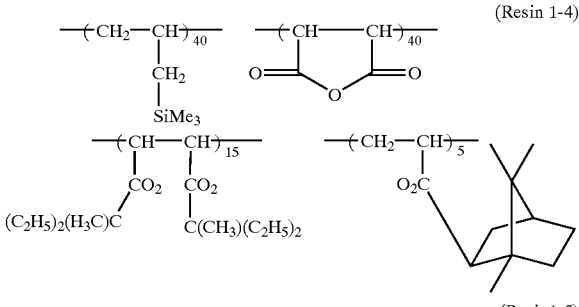

(Resin 1-4)

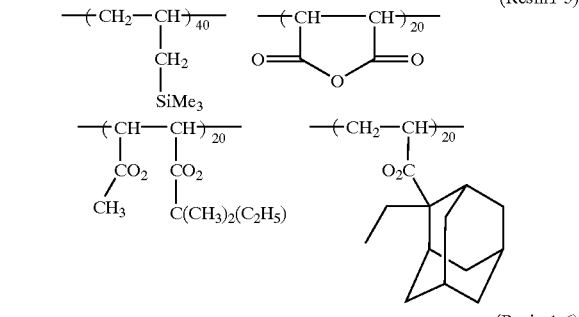

(Resin1-5)

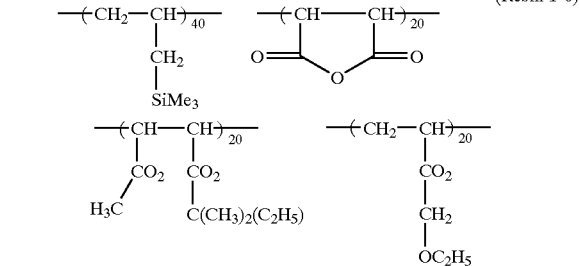

(Resin 1-6)

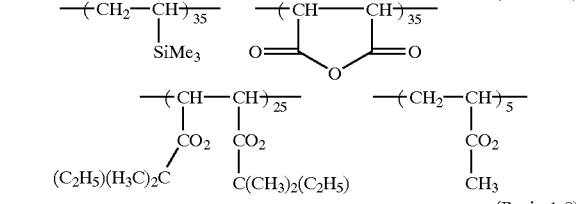

(Resin 1-7)

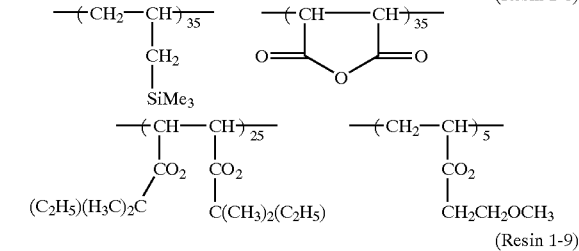

(Resin 1-8)

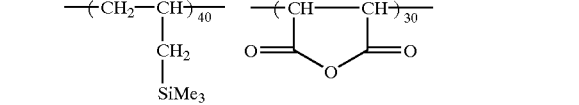

(Resin 1-9)

-continued

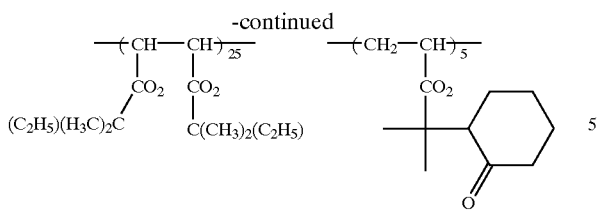

Synthesis Example (3)

Synthesis of Resin (2-1)

11.4 g of trimethylallylsilane, 9.8 g of maleic anhydride and 7.1 g of t-amyl acrylate were added to 34 g of dried THF. The mixture was then heated to a temperature of 65° C. in a stream of nitrogen. When the reaction temperature was stabilized, a Type V-65 initiator produced by Wako Pure Chemical Industries, Ltd. was then added in an amount of 10 mol-% based on the total molar amount of the monomers to initiate reaction.

After 6 hours of reaction, the reaction mixture was diluted twice with THF, and then poured into a large amount of hexane to cause precipitation of white powder. Subsequently, in order to reduce the amount of residual monomer and low molecular weight components, the powder thus precipitated was dissolved in acetone. To the solution was then added hexane by small portions to cause precipitation of polymer. The polymer thus precipitated in the lower layer was dissolved in acetone again, and then poured into a large amount of hexane to cause precipitation of white powder. The white polymer was recovered by filtration and then dried under reduced pressure to obtain a resin (2-1).

The resin (2-1) thus obtained was then measured for molecular weight by GPC. The results were 5,600 as calculated in terms of weight-average molecular weight with polystyrene as a standard sample. The content of components having a molecular weight of 1,000 or less was 4% as calculated in terms of area ratio on GPC.

Synthesis Example (4)

Synthesis of Resins (2-2) to (2-9)

Resins (2-2) to (2-9) were then obtained in the same manner as in Synthesis Example (3).

The molar ratio of various repeating units constituting the resins (2-1) to (2-9) and the structural formulae of these resins are shown below.

(Resin 2-1)

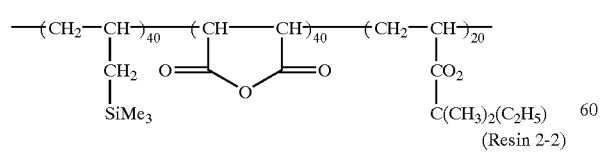

(Resin 2-2)

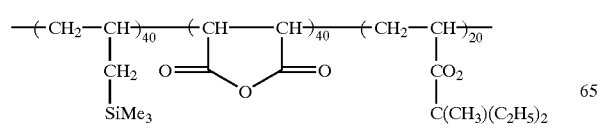

(Resin 2-3)

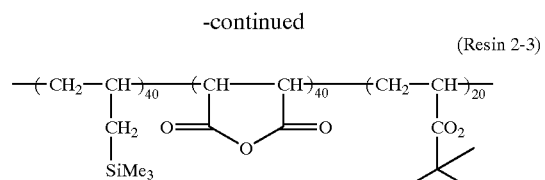

(Resin 2-4)

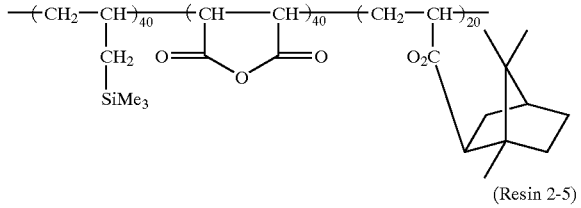

(Resin 2-5)

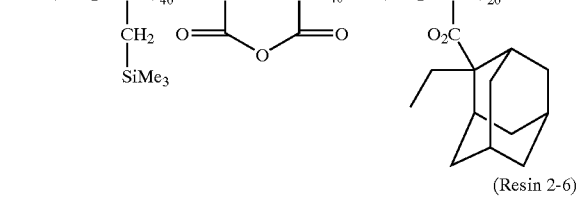

(Resin 2-6)

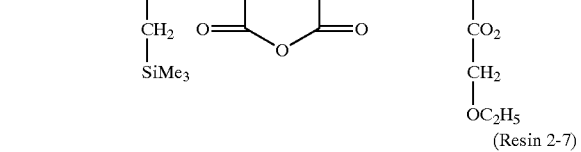

(Resin 2-7)

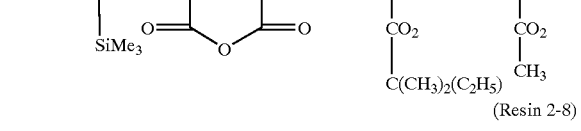

(Resin 2-8)

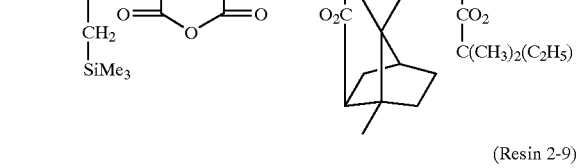

(Resin 2-9)

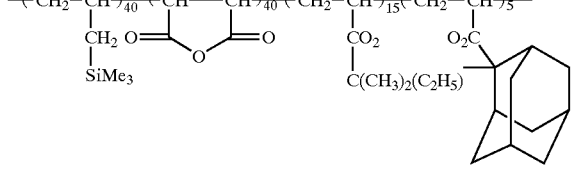

Synthesis Example (5)

Synthesis of Resin (A): Maleic anhydride/t-butyl acrylate/allyltrimethylsilane Copolymer Synthesis was conducted in the same manner as in Synthesis Example (3), except that 6.4 g of t-butyl acrylate was used instead of 7.1 g of t-amyl acrylate to obtain maleic anhydride/t-butyl acrylate/allyltrimethylsilane copolymer (resin (A)).

The resin (A) thus obtained had a weight-average molecular weight of 10,200 and the content of components having a molecular weight of 1,000 or less was 2% as calculated in terms of area ratio on GPC.

Example I 2 g of the resin set forth in Table 1 below as the component (A), 0.12 g of the photo-acid generator (B') set forth in Table 1 below, 0.003 g of the surface active agent set forth in Table 1 below as the component (C) and 0.004 g of the organic basic compound set forth in Table 1 below as the component (D) were dissolved in 19.2 g of propylene glycol monomethyl ether acetate, and then subjected to precision filtration through a membrane filter having a pore diameter of 0.1 μm to obtain a positive-working photoresist solution.

Comparative Example I

A positive-working photoresist composition was prepared in the same manner as in Example I except that the following organic basic compound and/or fluorine-based, silicon-based or nonionic surface active agent were excluded and photo-acid generators other than onium salt were used as set forth in Table 2.

TABLE 1

| Example | (A) Resin Component Structure | Mw | (B) Photo-acid generator | (C) Surface active agent | (D) Organic basic compound |
|---|---|---|---|---|---|
| 1 | Resin (1-1) | 7600 | SII-4 | 1 | 1 |
| 2 | Resin (1-1) | 7600 | PAG4-2 | 1 | 1 |
| 3 | Resin (1-2) | 7900 | SII-4 | 2 | 2 |
| 4 | Resin (1-2) | 7900 | SI-6 | 2 | 2 |
| 5 | Resin (1-3) | 7900 | SII-7 | None | None |
| 6 | Resin (1-3) | 7900 | SI-3 | 3 | None |
| 7 | Resin (1-4) | 8100 | SII-7 | 4 | 1 |
| 8 | Resin (1-4) | 8100 | SII-2 | 4 | 1 |
| 9 | Resin (1-5) | 5600 | SII-9 | 2 | 2 |
| 10 | Resin (1-5) | 5600 | SI-9 | 2 | 2 |
| 11 | Resin (1-6) | 8300 | SII-4 | 3 | 1 |
| 12 | Resin (1-6) | 8300 | SII-3 | 3 | 1 |
| 13 | Resin (1-7) | 5300 | SII-9 | 4 | 2 |
| 14 | Resin (1-7) | 5300 | SII-14 | 4 | 2 |
| 15 | Resin (1-8) | 5100 | SII-7 | 1 | 1 |
| 16 | Resin (1-8) | 5100 | PAG3-5 | 1 | 1 |
| 17 | Resin (1-9) | 10490 | SII-4 | 2 | 2 |
| 18 | Resin (1-9) | 10490 | SII-8 | 2 | 2 |
| 19 | Resin (2-1) | 5600 | SII-4 | 3 | 1 |
| 20 | Resin (2-1) | 5600 | SII-3 | 3 | 1 |
| 21 | Resin (2-2) | 13570 | SII-7 | 2 | 2 |
| 22 | Resin (2-2) | 13570 | SII-3/SI-3 = 2/1 | 2 | 2 |
| 23 | Resin (2-3) | 6600 | SII-9 | 3 | None |
| 24 | Resin (2-3) | 6600 | PAG4-5 | 3 | None |
| 25 | Resin (2-4) | 7900 | SII-7 | 1 | 1 |
| 26 | Resin (2-4) | 7900 | SI-6 | 1 | 1 |
| 27 | Resin (2-5) | 8100 | SII-4 | 1 | 2 |
| 28 | Resin (2-5) | 8100 | PAG3-5 | 1 | 2 |
| 29 | Resin (2-6) | 13570 | SII-7 | 3 | 1 |
| 30 | Resin (2-6) | 13570 | SII-14 | 3 | 1 |
| 31 | Resin (2-7) | 16170 | SII-9 | 2 | 2 |
| 32 | Resin (2-7) | 16170 | SII-3 | 2 | 2 |
| 33 | Resin (2-8) | 10490 | SII-7 | 2 | 1 |
| 34 | Resin (2-8) | 10490 | SII-8 | 2 | 1 |
| 35 | Resin (2-9) | 5100 | SII-4 | 1 | 2 |
| 36 | Resin (9-9) | 5100 | SII-2 | 1 | 2 |

TABLE 2

| Comparative Example | (A) Resin Component Structure | Mw | (B) Photo-acid generator | (C) Surface active agent | (D) Organic basic compound |
|---|---|---|---|---|---|
| 1 | Resin (1-1) | 7600 | SI-5 | None | None |
| 2 | Resin (1-2) | 7900 | SII-4 | None | None |
| 3 | Resin (1-3) | 7900 | SII-4 | None | None |
| 4 | Resin (1-4) | 8100 | PAG6-2 | 1 | 1 |
| 5 | Resin (1-5) | 5600 | SI-3 | 3 | 2 |
| 6 | Resin (1-6) | 8300 | SI-5 | None | None |
| 7 | Resin (1-7) | 5300 | SII-3 | None | None |
| 8 | Resin (1-8) | 5100 | SII-3 | None | None |
| 9 | Resin (1-9) | 10490 | SII-3 | None | None |
| 10 | Resin (2-1) | 5600 | SII-4 | 3 | 2 |
| 11 | Resin (2-2) | 13570 | SII-3 | None | None |
| 12 | Resin (2-3) | 6600 | PAG6-2 | 2 | None |
| 13 | Resin (2-4) | 7900 | PAG3-5 | None | 2 |
| 14 | Resin (2-5) | 8100 | SII-4 | None | None |
| 15 | Resin (2-6) | 13570 | SI-6 | None | None |
| 16 | Resin (2-7) | 16170 | PAG6-2 | None | None |
| 17 | Resin (2-8) | 10490 | SII-4 | None | None |
| 18 | Resin (2-9) | 5100 | SII-8 | None | None |
| 19 | Resin (A) | 10200 | SI-5 | None | None |

Organic basic compound 1: DMAP(4-dimethylaminopyridine)
Organic basic compound 2: TPI(2,4,5-triphenylimidazole)
The surface active agents used are as follows:
1: Megafac F176 (fluorine-based; produced by DAINIPPON INK & CHEMICALS, INC.)
2: Megafac R08 (fluorine-based and silicon-based; produced by DAINIPPON INK & CHEMICALS, INC.)
3: Polysiloxane polymer KP-341 (produced by Shin-Etsu Chemical Co., Ltd.)
4: Polyoxyethylene nonyl phenyl ether A Type FHi-028D resist (resin for i-line produced by Fuji Film Olin Co., Ltd.) was applied to a silicon wafer by means of a Type CDS-650 coater produced by CANON INC., and then baked at a temperature of 90° C. for 90 seconds to obtain a uniform film having a thickness of 0.83 μm. The coated material was then further heated to a temperature of 200° C. for 3 minutes. As a result, the thickness of the film was 0.71 μm. The positive-working photoresist composition solution previously prepared was applied to the resist film, and then baked at a temperature of 135° C. for 90 seconds to form a film having a thickness of 80 nm.

The wafer thus obtained was then exposed to light with the exposure and focus being varied by loading a resolution mask in an ArF excimer laser stepper manufactured by ISI Co. The wafer thus exposed was heated to a temperature of 125° C. for 90 seconds in a clean room. Deionized water was then put on the resist film for 60 seconds. Thereafter, deionized water was removed. The wafer was then developed with FHD-5 (2.38% by weight, tetramethyl ammonium hydroxide developer) for 60 seconds. The wafer thus developed was rinsed with distilled water, and then dried to form a pattern which was then observed under scanning electron microscope. The wafer thus processed was then evaluated for sensitivity, number of particles thus produced, increased number of particles after aging storage and dependence on density in the following manner.

[Number of Particles and Increased Number of Particles after Aging storage]

The positive-working photoresist composition solution (coating solution) thus prepared was examined for the number of particles shortly after preparation (initial number of particles) and after 1 week of storage at 4° C. (number of particles after aging) by means of a particle counter produced by Rion Co., Ltd. Thus, the initial number of particles as well as the increased number of particles calculated by (number of particles after aging)−(initial number of particles) were evaluated.

[Sensitivity]

The sensitivity is defined by the lowest exposure (mJ/cm$^2$) at which a 0.15 μm mask pattern can be reproduced. The sensitivity is represented relative to the lowest exposure of Example 1 as 1.

[Percent Sensitivity Change]

The positive-working photoresist composition solution (coating solution) thus prepared was evaluated for sensitivity shortly after preparation (exposure before storage) and sensitivity after 1 week of storage at 4° C. (exposure after storage) in the foregoing manner. The percent sensitivity change was then calculated by the following equation:

% Sensitivity change=|(exposure before storage)−(exposure after storage)|/(exposure before storage)×100

[Dependence on Density]

Each in a line-and-space pattern having a line width of 0.15 μm (dense pattern) and a lone line pattern (sparse pattern), the range of overlapping of focus depth within which 0.15 μm±10% can be tolerated was determined. The greater the range thus defined is, the better is the dependence on density.

The results of these evaluations are set forth in Tables 3 and 4.

TABLE 3

| Example | Sensitivity | Percent sensitivity change | Initial number of particles | Increased number of particles | Dependence of density |
|---|---|---|---|---|---|
| 1 | 1.0 | <5 | 5 | 5 | 0.8 |
| 2 | 1.2 | <5 | 5 | 5 | 0.8 |
| 3 | 1.0 | <5 | 5 | 10 | 0.8 |
| 4 | 1.3 | <5 | 5 | 10 | 0.7 |
| 5 | 1.0 | 10 | 10 | 10 | 0.8 |
| 6 | 1.2 | 10 | 10 | 10 | 0.6 |
| 7 | 0.9 | <5 | 20 | 5 | 0.8 |
| 8 | 1.1 | <5 | 10 | 5 | 0.8 |
| 9 | 0.8 | <5 | 5 | 10 | 1.0 |
| 10 | 1.1 | <5 | 5 | 5 | 1.1 |
| 11 | 0.9 | 10 | 5 | 5 | 0.9 |
| 12 | 1.1 | 10 | 5 | 5 | 1.1 |
| 13 | 1.0 | <5 | 10 | 10 | 0.8 |
| 14 | 1.3 | <5 | 10 | 10 | 0.8 |
| 15 | 1.1 | <5 | 10 | 10 | 0.8 |
| 16 | 1.3 | <5 | 5 | 5 | 0.9 |
| 17 | 1.2 | <5 | 5 | 10 | 1.1 |
| 18 | 1.4 | <5 | 10 | 10 | 1.1 |
| 19 | 1.0 | <5 | 5 | 10 | 0.9 |
| 20 | 1.2 | <5 | 10 | 20 | 0.8 |
| 21 | 1.0 | 10 | 10 | 20 | 0.8 |
| 22 | 1.2 | 10 | 10 | 25 | 0.9 |
| 23 | 1.0 | <5 | 10 | 10 | 1.0 |
| 24 | 1.2 | <5 | 5 | 25 | 1.0 |
| 25 | 1.1 | <5 | 10 | 20 | 1.0 |
| 26 | 1.3 | <5 | 5 | 15 | 1.1 |
| 27 | 1.1 | 10 | 20 | 10 | 0.9 |
| 28 | 1.4 | 10 | 10 | 15 | 1.1 |
| 29 | 1.0 | 10 | 10 | 10 | 0.9 |
| 30 | 1.1 | 10 | 5 | 15 | 1.0 |
| 31 | 1.1 | <5 | 5 | 15 | 1.1 |
| 32 | 1.3 | <5 | 5 | 10 | 1.0 |
| 33 | 1.0 | <5 | 10 | 15 | 1.1 |
| 34 | 1.3 | <5 | 10 | 15 | 0.8 |
| 35 | 1.2 | 10 | 10 | 15 | 0.8 |
| 36 | 1.4 | 10 | 20 | 10 | 0.9 |

TABLE 4

| Comparative Example | Sensitivity | Percent sensitivity change | Initial number of particles | Increased number of particles | Dependence of density |
|---|---|---|---|---|---|
| 1 | 1.6 | 40 | 55 | 60 | 0.1 |
| 2 | 2.6 | 40 | 200 | 500 | 0.2 |
| 3 | 1.9 | 40 | 60 | 70 | 0.1 |
| 4 | 3.4 | 40 | 150 | 90 | 0.2 |
| 5 | 3.8 | 35 | 40 | 150 | 0.1 |
| 6 | 1.9 | 30 | 120 | 170 | 0.1 |
| 7 | 2.6 | 30 | 280 | 250 | 0.1 |
| 8 | 3.4 | 40 | 190 | 60 | 0.1 |
| 9 | 3.8 | 35 | 200 | 190 | 0.2 |
| 10 | 3.1 | 30 | 140 | 90 | 0.2 |
| 11 | 2.7 | 30 | 190 | 170 | 0.2 |
| 12 | 3.5 | 35 | 230 | 120 | 0.1 |
| 13 | 3.7 | 30 | 190 | 130 | 0.2 |
| 14 | 3.5 | 30 | 80 | 190 | 0.1 |
| 15 | 3.1 | 40 | 120 | 290 | 0.1 |
| 16 | 2.7 | 35 | 40 | 120 | 0.1 |
| 17 | 2.7 | 40 | 55 | 110 | 0.2 |
| 18 | 3.4 | 40 | 100 | 160 | 0.2 |
| 19 | 2.0 | 40 | 90 | 160 | 0.2 |

As can be seen in the foregoing results, the composition of the invention is excellent in all the properties evaluated.

The positive-working photoresist composition for exposure to far ultraviolet ray of the invention is suitable for the exposure to far ultraviolet ray having a wavelength of from 170 nm to 220 nm and exhibits a high sensitivity, an improved age stability in the form of solution and an excellent dependence on density.

Example II 2 g of the resin set forth in Table 5 or 6 below as the component (A), 0.15 g of the photo-acid generator (B) set forth in Table 5 or 6 below, 0.003 g of the surface active agent set forth in Table 5 or 6 below as the component (D) and 0.004 g of the organic basic compound set forth in Table 5 or 6 below as the component (E) were dissolved in 19.2 g of the mixed solvent set forth in Table 5 or 6 below, and then subjected to precision filtration through a membrane filter having a pore diameter of 0.15 μm to obtain a positive-working photoresist solution.

Comparative Example II

A positive-working photoresist composition was prepared in the same manner as in Example II except that the following organic basic compound and/or fluorine-based, silicon-based or nonionic surface active agent were excluded and mixed solvents other than the mixed solvents according to the invention were used.

TABLE 5

| Example | (A) Resin Structure | (A) Resin Mw | (B) Photo-acid generator | (C) Solvent | (D) Surface active agent | (E) Organic basic compound |
|---|---|---|---|---|---|---|
| 1 | Resin (1-1) | 7600 | SII-4 | S1/S3 = 80/20 | 1 | 1 |
| 2 | Resin (1-1) | 7600 | PAG4-2 | S1/S4 = 80/20 | 1 | 1 |
| 3 | Resin (1-2) | 7900 | SII-4 | S1/S5 = 70/30 | 2 | 2 |
| 4 | Resin (1-2) | 7900 | SI-6 | S2/S3 = 85/15 | 2 | 2 |
| 5 | Resin (1-3) | 7900 | SII-7 | S1/S6 = 92/8 | 3 | None |
| 6 | Resin (1-3) | 7900 | SI-3 | S1/S7 = 96/4 | 3 | None |
| 7 | Resin (1-4) | 8100 | SII-7 | S1/S8 = 97/3 | 4 | 1 |

TABLE 5-continued

| Example | (A) Resin Structure | Mw | (B) Photo-acid generator | (C) Solvent | (D) Surface active agent | (E) Organic basic compound |
|---|---|---|---|---|---|---|
| 8 | Resin (1-4) | 8100 | SII-2 | S2/S6 = 95/5 | 4 | 1 |
| 9 | Resin (1-5) | 5600 | SII-9 | S1/S3/S7 = 87/10/3 | 2 | 2 |
| 10 | Resin (1-5) | 5600 | SI-9 | S1/S4/S8 = 80/16/4 | 2 | 2 |
| 11 | Resin (1-6) | 8300 | SII-4 | S1/S5/S6 = 83/14/3 | 3 | 1 |
| 12 | Resin (1-6) | 8300 | SII-3 | S1/S5 = 75/25 | 3 | 1 |
| 13 | Resin (1-7) | 5300 | SII-9 | S1/S8 = 95/5 | 4 | 2 |
| 14 | Resin (1-7) | 5300 | SII-14 | S2/S4/S8 = 70/25/5 | 4 | 2 |
| 15 | Resin (1-8) | 5100 | SII-7 | S1/S3/S8 = 77/2/3 | 1 | 1 |
| 16 | Resin (1-8) | 5100 | PAG3-5 | S1/S5 = 70/30 | 1 | 1 |
| 17 | Resin (1-9) | 10490 | SII-4 | S2/S3 = 85/15 | 2 | 2 |
| 18 | Resin (1-9) | 10490 | SII-8 | S1/S6 = 92/8 | 2 | 2 |
| 19 | Resin (2-1) | 5600 | SII-4 | S1/S7 = 96/4 | 3 | 1 |
| 20 | Resin (2-1) | 5600 | SII-3 | S1/S8 = 97/3 | 3 | 1 |

TABLE 6

| Example | (A) Resin Structure | Mw | (B) Photo-acid generator | (C) Solvent | (D) Surface active agent | (E) Organic basic compound |
|---|---|---|---|---|---|---|
| 21 | Resin (2-2) | 13570 | SII-7 | S1/S3/S7 = 87/10/3 | 2 | 2 |
| 22 | Resin (2-2) | 13570 | SII-3/Si-3 = 2/1 | S1/S5/S6 = 80/16/4 | 2 | 2 |
| 23 | Resin (2-3) | 6600 | SII-9 | S1/S5/S7 = 83/14/3 | 3 | None |
| 24 | Resin (2-3) | 6600 | PAG4-5 | S1/S8 = 97/3 | 3 | None |
| 25 | Resin (2-4) | 7900 | SII-7 | S2/S4/S7 = 87/10/3 | 1 | 1 |
| 26 | Resin (2-4) | 7900 | SI-6 | S1/S5/S6 = 80/16/4 | 1 | 1 |
| 27 | Resin (2-5) | 8100 | SII-4 | S1/S4 = 83/17 | 1 | 2 |
| 28 | Resin (2-5) | 8100 | PAG3-5 | S1/S6 = 93/7 | 1 | 2 |
| 29 | Resin (2-6) | 13570 | SII-7 | S1/S4/S7 = 87/10/3 | 3 | 1 |
| 30 | Resin (2-6) | 13570 | SII-14 | S1/S5/S6 = 80/16/4 | 3 | 1 |
| 31 | Resin (2-7) | 16170 | SII-9 | S1/S3/S7 = 87/10/3 | 2 | 2 |
| 32 | Resin (2-7) | 16170 | SII-3 | S1/S5/S6 = 84/12/4 | 2 | 2 |
| 33 | Resin (2-8) | 10490 | SII-7 | S1/S4/S8 = 87/10/3 | 2 | 1 |
| 34 | Resin (2-8) | 10490 | SII-8 | S1/S5/S8 = 80/16/1 | 2 | 1 |
| 35 | Resin (2-9) | 5100 | SII-4 | S1/S7 = 95/5 | 1 | 2 |
| 36 | Resin (2-9) | 5100 | SII-2 | S1/S7 = 95/5 | 1 | 2 |

TABLE 7

| Example | (A) Resin Structure | Mw | (B) Photo-acid generator | (C) Solvent | (D) Surface active agent | (E) Organic basic compound |
|---|---|---|---|---|---|---|
| 1 | Resin (1-1) | 7600 | SII-4 | S9 | None | None |
| 2 | Resin (1-1) | 7600 | PAG4-2 | S9 | 1 | None |
| 3 | Resin (1-2) | 7900 | SII-4 | S1 | None | 1 |
| 4 | Resin (1-2) | 7900 | SI-6 | S9 | None | None |
| 5 | Resin (1-3) | 7900 | SII-7 | S9 | 2 | None |
| 6 | Resin (1-3) | 7900 | SI-3 | S9 | 1 | None |
| 7 | Resin (1-4) | 8100 | SII-7 | S1 | None | 1 |
| 8 | Resin (1-4) | 8100 | SII-2 | S9 | None | 2 |
| 9 | Resin (1-5) | 5600 | SII-9 | S9 | None | None |
| 10 | Resin (1-5) | 5600 | SI-9 | S9 | 1 | None |
| 11 | Resin (1-6) | 8300 | SII-4 | S1 | None | 1 |
| 12 | Resin (1-6) | 8300 | SII-3 | S9 | None | None |
| 13 | Resin (1-7) | 5300 | SII-9 | S9 | None | None |
| 14 | Resin (1-7) | 5300 | SII-14 | S9 | 1 | None |
| 15 | Resin (1-8) | 5100 | SII-7 | S1 | None | 1 |
| 16 | Resin (1-8) | 5100 | PAG3-5 | S9 | None | None |
| 17 | Resin (1-9) | 10490 | SII-4 | S9 | None | None |
| 18 | Resin (1-9) | 10490 | SII-8 | S9 | 1 | None |
| 19 | Resin (2-1) | 5600 | SII-4 | S1 | None | 1 |
| 20 | Resin (2-1) | 5600 | SII-3 | S9 | 4 | None |
| 21 | Resin (2-2) | 13570 | SII-7 | S9 | 1 | None |
| 22 | Resin (2-2) | 13570 | SII-3/S1-3 = 2/1 | S1 | None | 1 |
| 23 | Resin (2-3) | 6600 | SII-9 | S9 | None | None |
| 24 | Resin (2-3) | 6600 | PAG4-5 | S9 | 1 | None |
| 25 | Resin (2-4) | 7900 | SII-7 | S1 | None | 1 |
| 26 | Resin (2-4) | 7900 | SI-6 | S9 | None | None |
| 27 | Resin (2-5) | 8100 | SII-4 | S9 | None | None |
| 28 | Resin (2-5) | 8100 | PAG3-5 | S9 | 1 | None |
| 29 | Resin (2-6) | 13570 | SII-7 | S1 | None | 1 |
| 30 | Resin (2-6) | 13570 | SII-14 | S9 | None | 2 |
| 31 | Resin (2-7) | 16170 | SII-9 | S9 | 4 | None |
| 32 | Resin (2-7) | 16170 | SII-3 | S9 | 1 | None |
| 33 | Resin (2-8) | 10490 | SII-7 | S9 | None | None |
| 34 | Resin (2-8) | 10490 | SII-8 | S9 | 1 | None |
| 35 | Resin (2-9) | 5100 | SII-4 | S1 | None | 1 |
| 36 | Resin (2-9) | 5100 | SII-2 | S9 | None | None |
| 37 | Resin (A) | 10200 | SII-4 | S9 | None | None |
| 38 | Resin (A) | 10200 | SII-4 | S9 | None | 2 |

Organic basic compound 1: DMAP(4-dimethylaminopyridine)
Organic basic compound 2: TPI(2,4,5-triphenylimidazole)
The solvents used are as follows:
  S1: Propylene glycol monomethyl ether acetate
  S2: Propylene glycol monomethyl ether propionate
  S3: Ethyl lactate
  S4: Propylene glycol monomethyl ether
  S5: Ethoxyethyl propionate
  S6: γ-Butylolactone
  S7: Ethylene carbonate
  S8: Propylene carbonate
  S9: Cyclohexanone
The surface active agents used are as follows:
  1: Megafac F176 (fluorine-based; produced by DAINIPPON INK & CHEMICALS, INC.)
  2: Megafac R08 (fluorine-based and silicon-based; produced by DAINIPPON INK & CHEMICALS, INC.)
  3: Polysiloxane polymer KP-341 (produced by Shin-Etsu Chemical Co., Ltd.)
  4: Polyoxyethylene nonyl phenyl ether A Type FHi-028D resist (resin for i-line produced by Fuji Film Olin Co., Ltd.) was applied to a silicon wager by means of a Type CDS-650 coater produced by CANON INC., and then baked at a temperature of 90° C. for 90 seconds to obtain a uniform film having a thickness of 0.83 µm. The coated material was then further heated to a temperature of 200° C. for 3 minutes. As a result, the thickness of the film was 0.71 µm. The positive-working photoresist composition solution previously prepared was applied to the resist film, and then baked at a temperature of 135° C. for 90 seconds to form a film having a thickness of 80 nm.

The wafer thus obtained was then exposed to light with the exposure and focus being varied by loading a resolution mask in an ArF excimer laser stepper produced by ISI Inc. The wafer thus exposed was heated to a temperature of 125° C. for 90 seconds in a clean room. Deionized water was then put on the resist film for 60 seconds. Thereafter, deionized water was removed. The wafer was then developed with FHD-5 (2.38% tetramethyl ammonium hydroxide developer) for 60 seconds. The wafer thus developed was rinsed with distilled water, and then dried to form a pattern which was then observed under scanning electron microscope. The wafer thus processed was then evaluated for sensitivity, number of particles thus produced, increased number of particles after aging storage and dependence on density in the following manner.

[Edge Roughness]

Using a scanning electron microscope (SEM), measurement of edge roughness was made on a 0.13 µm line-and-space (line/space=1/1.2) pattern. Line pattern edges were then detected at plural sites in a measurement monitor. The dispersion (3σ) of detection sites is defined as index of edge roughness. The smaller this value is, the less is edge roughness.

[Number of Particles and Increased Number of Particles after Aging Storage]

The positive-working photoresist composition solution (coating solution) thus prepared was examined for the number of particles shortly after preparation (initial number of particles) and after 1 week of storage at 4° C. (number of particles after aging) by means of a particle counter produced by Rion Co., Ltd. Thus, the initial number of particles as well as the increased number of particles calculated by (number of particles after aging)−(initial number of particles) were evaluated.

[Percent Sensitivity Change]

The positive-working photoresist composition solution (coating solution) thus prepared was evaluated for sensitivity shortly after preparation (exposure before storage) and sensitivity after 1 week of storage at 4° C. (exposure after storage) in the foregoing manner. The percent sensitivity change was then calculated by the following equation.

The sensitivity is defined by the lowest exposure (mJ/cm$^2$) at which a 0.13 µm line-and-space (line/space=1/1.2) pattern can be reproduced.

% Sensitivity change={(exposure before storage)−(exposure after storage)}/(exposure before storage)×100

[Dependence on Density]

Each in a line-and-space pattern having a line width of 0.15 µm (dense pattern) and a lone line pattern (sparse pattern), the range of overlapping of focus depth within which 0.15 µm±10% can be tolerated was determined. The greater the range thus defined is, the better is the dependence on density.

The results of these evaluations are set forth in Tables 8 and 9.

TABLE 8

| Example | Roughness (nm) | Percent sensitivity change | Initial number of particles | Increased number of particles | Dependence of density |
|---|---|---|---|---|---|
| 1 | 10 | <5 | 5 | 5 | 0.8 |
| 2 | 11 | <5 | 5 | 5 | 0.8 |
| 3 | 12 | <5 | 5 | 10 | 0.8 |
| 4 | 13 | <5 | 5 | 10 | 0.7 |
| 5 | 11 | 10 | 10 | 10 | 0.8 |
| 6 | 12 | 10 | 10 | 10 | 0.6 |
| 7 | 8 | <5 | 20 | 5 | 0.8 |
| 8 | 12 | <5 | 10 | 5 | 0.8 |
| 9 | 8 | <5 | 5 | 10 | 1.0 |
| 10 | 12 | <5 | 5 | 5 | 1.1 |
| 11 | 10 | 10 | 5 | 5 | 0.9 |
| 12 | 11 | 10 | 5 | 5 | 1.1 |
| 13 | 10 | <5 | 10 | 10 | 0.8 |
| 14 | 12 | <5 | 10 | 10 | 0.8 |
| 15 | 11 | <5 | 10 | 10 | 0.8 |
| 16 | 10 | <5 | 5 | 5 | 0.9 |
| 17 | 12 | <5 | 5 | 10 | 1.1 |
| 18 | 12 | <5 | 10 | 10 | 1.1 |
| 19 | 10 | <5 | 5 | 10 | 0.9 |
| 20 | 8 | <5 | 10 | 20 | 0.8 |
| 21 | 10 | 10 | 10 | 20 | 0.8 |
| 22 | 9 | 10 | 10 | 25 | 0.9 |
| 23 | 8 | <5 | 10 | 10 | 1.0 |
| 24 | 11 | <5 | 5 | 25 | 1.0 |
| 25 | 11 | <5 | 10 | 20 | 1.0 |
| 26 | 13 | <5 | 5 | 15 | 1.1 |
| 27 | 11 | 10 | 20 | 10 | 0.9 |
| 28 | 12 | 10 | 10 | 15 | 1.1 |
| 29 | 10 | 10 | 10 | 10 | 0.9 |
| 30 | 12 | 10 | 5 | 15 | 1.0 |
| 31 | 12 | <5 | 5 | 15 | 1.1 |
| 32 | 13 | <5 | 5 | 10 | 1.0 |
| 33 | 12 | <5 | 10 | 15 | 1.1 |
| 34 | 13 | <5 | 10 | 15 | 0.8 |
| 35 | 11 | 10 | 10 | 15 | 0.8 |
| 36 | 10 | 10 | 20 | 10 | 0.9 |

TABLE 9

| Comparative Example | Roughness (nm) | Percent sensitivity change | Initial number of particles | Increased number of particles | Dependence of density |
|---|---|---|---|---|---|
| 1 | 24 | 40 | 55 | 60 | 0.1 |
| 2 | 26 | 40 | 200 | 500 | 0.2 |
| 3 | 19 | 40 | 60 | 70 | 0.1 |
| 4 | 24 | 40 | 150 | 90 | 0.2 |
| 5 | 28 | 35 | 140 | 150 | 0.1 |
| 6 | 19 | 30 | 120 | 170 | 0.1 |
| 7 | 26 | 30 | 280 | 250 | 0.1 |
| 8 | 24 | 40 | 190 | 60 | 0.1 |
| 9 | 28 | 35 | 140 | 150 | 0.1 |
| 10 | 21 | 30 | 120 | 170 | 0.1 |
| 11 | 27 | 30 | 280 | 250 | 0.1 |
| 12 | 25 | 40 | 190 | 60 | 0.1 |
| 13 | 27 | 35 | 200 | 190 | 0.2 |
| 14 | 25 | 30 | 80 | 190 | 0.1 |
| 15 | 25 | 40 | 120 | 290 | 0.1 |
| 16 | 27 | 35 | 40 | 120 | 0.1 |
| 17 | 27 | 40 | 55 | 110 | 0.2 |
| 18 | 24 | 40 | 100 | 160 | 0.2 |
| 19 | 19 | 35 | 140 | 150 | 0.1 |
| 20 | 26 | 30 | 120 | 170 | 0.1 |
| 21 | 19 | 30 | 280 | 250 | 0.1 |
| 22 | 24 | 40 | 190 | 60 | 0.1 |
| 23 | 28 | 35 | 200 | 190 | 0.2 |
| 24 | 19 | 30 | 120 | 170 | 0.1 |
| 25 | 26 | 35 | 200 | 190 | 0.2 |
| 26 | 24 | 30 | 80 | 190 | 0.1 |
| 27 | 28 | 40 | 120 | 250 | 0.1 |
| 28 | 19 | 30 | 140 | 90 | 0.2 |
| 29 | 17 | 30 | 190 | 170 | 0.2 |

TABLE 9-continued

| Comparative Example | Roughness (nm) | Percent sensitivity change | Initial number of particles | Increased number of particles | Dependence of density |
|---|---|---|---|---|---|
| 30 | 25 | 35 | 230 | 120 | 0.1 |
| 31 | 27 | 30 | 190 | 130 | 0.2 |
| 32 | 25 | 30 | 80 | 190 | 0.1 |
| 33 | 19 | 40 | 120 | 290 | 0.1 |
| 34 | 17 | 35 | 40 | 120 | 0.1 |
| 35 | 19 | 40 | 55 | 110 | 0.2 |
| 36 | 20 | 40 | 100 | 60 | 0.2 |
| 37 | 20 | 35 | 40 | 90 | 0.2 |
| 38 | 20 | 35 | 60 | 120 | 0.2 |

As can be seen in the foregoing results, the composition of the invention is excellent in all the properties evaluated.

The positive-working photoresist composition for exposure to far ultraviolet ray of the invention is suitable for the exposure to far ultraviolet ray having a wavelength of from 170 nm to 220 nm and is less liable to edge roughness on resist pattern and free from production of particles in its solution.

While the invention has been described in detail and with reference to specific embodiments thereof, it will be apparent to one skilled in the art that various changes and modifications can be made therein without departing from the spirit and scope thereof.

What is claimed is:

1. A positive-working photoresist composition comprising (A) a resin comprising a repeating structural unit represented by the following general formula (I) and a repeating structural unit represented by at least one of the following general formulae (IIa) and (IIb) which resin increases in its solubility in an alkaline developer when acted upon by an acid, (B') an onium salt compound which generates an acid when irradiated with active ray or radiation and (C) at least one surface active agent selected from the group consisting of a nonionic surface active agent, a fluorine-based surface active agent, a silicon based surface active agent and a surface active agent containing at least one fluorine atom and at least one silicon atom:

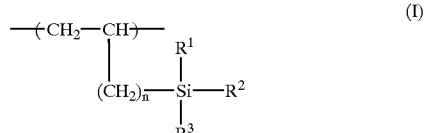
(I)

wherein $R^1$ to $R^3$ each independently represents an alkyl group, haloalkyl group, halogen atom, alkoxy group, trialkylsilyl group or trialkylsilyloxy group; and n represents an integer of 0 or 1;

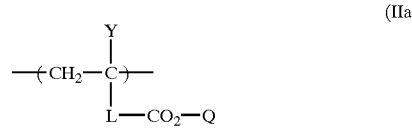
(IIa)

wherein Y represents a group selected from the group consisting of hydrogen atom, methyl group, cyano group and chlorine atom; L represents a single bond or divalent connecting group; and Q represents a tertiary alkyl group having 5 to 20 carbon atoms, alkoxymethyl group, alkoxyethyl group or isobornyl group;

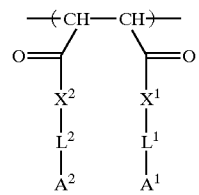
(IIb)

wherein $X^1$ and $X^2$ each independently represents a group selected from the group consisting of oxygen atom, sulfur atom, —NH— and —NHSO$_2$—; $L^1$ and $L^2$ each independently represents a single bond or divalent connecting group; $A^1$ represents —Q or —COOQ, with the proviso that when $X^1$ is an oxygen atom and $L^1$ is a single bond, $A^1$ represents —Q; $A^2$ represents a hydrogen atom, cyano group, hydroxyl group, —COOH, —COOR', —CO—NH—R", alkyl group which may be substituted, cyclic hydrocarbon group which may be substituted, alkoxy group, —Q or —COOQ in which R' and R" each independently represents an alkyl group which may have a substituent; and Q represents a tertiary alkyl group having 5 to 20 carbon atoms, alkoxymethyl group, alkoxyethyl group or isobornyl group.

2. The positive-working photoresist composition according to claim 1, wherein the resin (A) contains a repeating structural unit represented by the following general formula (III):

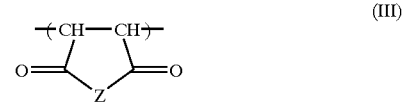
(III)

wherein Z represents an oxygen atom or N—$R^3$ in which $R^3$ represents a hydrogen atom, hydroxyl group, straight-chain or branched alkyl group or —O—SO$_2$—$R^4$ in which $R^4$ represents an alkyl group or trihalomethyl group.

3. The positive-working photoresist composition according to claim 1, wherein the onium salt compound (B') is a compound represented by the following general formula [sI] or [sII] which generates an acid when irradiated with active ray or radiation:

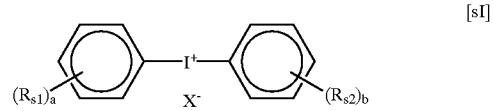
[sI]

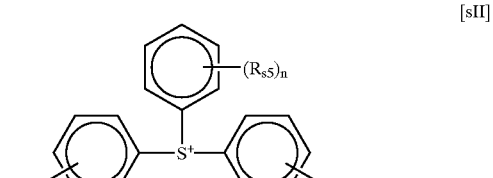
[sII]

wherein Rs1 to Rs5 each independently represents a hydrogen atom, alkyl group which may have a substituent, cycloalkyl group which may have a substituent, alkoxy group which may have a substituent, alkoxycarbonyl group which may have a substituent, acyl group which may have a substituent, acyloxy group which may have a substituent, nitro group, halogen atom, hydroxyl group or carboxyl group; a, b and l each independently represents an integer of from 1 to 5; m and n each independently represents an integer of from 0 to 5; when plural groups corresponding to Rs1, Rs2, Rs3, Rs4 or Rs5 are present, these groups may be the same or different, with the proviso that in formula [sI] at least one of the groups represented by $Rs_1$ and $Rs_2$ represents an alkyl, cycloalkyl, alkoxy, alkoxycarbonyl, acyl or acyloxy group having 5 or more carbon atoms which may have a substituent and that in formula [sII] when the sum of l, m and n is 1, $Rs_3$ represents an alkyl, cycloalkyl, alkoxy, alkoxycarbonyl, acyl or acyloxy group which may have a substituent; and X represents R—$SO_3$ in which R represents an aliphatic or aromatic hydrocarbon group which may have a substituent.

4. The positive-working photoresist composition according to claim 3, wherein R represents a fluorinated aliphatic hydrocarbon group or fluorinated aromatic hydrocarbon group.

5. The positive-working photoresist composition according to claim 3, wherein R represents nonafluorobutyl group.

6. The positive-working photoresist composition according to claim 1, further comprising an organic basic compound.

7. A positive-working photoresist composition comprising (A) a resin comprising a repeating structural unit represented by the following general formula (I) and a repeating structural unit represented by at least one of the following general formulae (IIa) and (IIb) which resin increases in its solubility in an alkaline developer when acted upon by an acid, (B) a compound which generates an acid when irradiated with active ray or radiation, and (D) a mixed solvent containing: (1) at least one solvent belonging to the group a; and (2) at least one solvent belonging to the group b and/or at least one solvent belonging to the group c:

Group a: propylene glycol monoalkyl ether carboxylate;
Group b: propylene glycol monoalkyl ether, alkyl lactate, alkoxyalkyl propionate; and
Group c: γ-Butyrolactone, ethylene carbonate, Propylene carbonate;

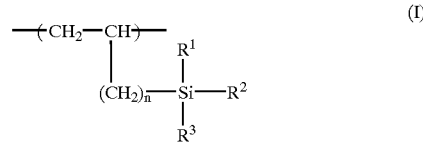
(I)

wherein $R^1$ to $R^3$ each independently represents an alkyl group, haloalkyl group, halogen atom, alkoxy group, trialkylsilyl group or trialkylsilyloxy group; and n represents an integer of 0 or 1;

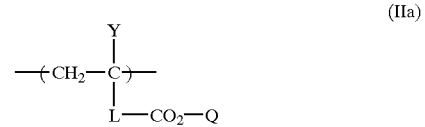
(IIa)

wherein Y represents a group selected from the group consisting of hydrogen atom, methyl group, cyano group and chlorine atom; L represents a single bond or divalent connecting group; and Q represents a tertiary alkyl group having 5 to 20 carbon atoms, alkoxymethyl group, alkoxyethyl group or isobornyl group;

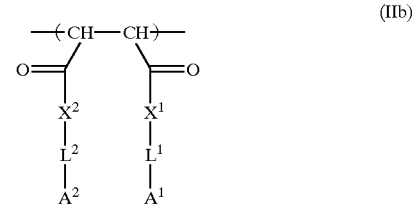
(IIb)

wherein $X^1$ and $X^2$ each independently represents a group selected from the group consisting of oxygen atom, sulfur atom, —NH— and —$NHSO_2$—; $L^1$ and $L^2$ each independently represents a single bond or divalent connecting group; $A^1$ represents —Q or —COOQ, with the proviso that when $X^1$ is an oxygen atom and $L^1$ is a single bond, $A^1$ represents —Q; $A^2$ represents a hydrogen atom, cyano group, hydroxyl group, —COOH, —COOR', —CO—NH—R", alkyl group which may be substituted, cyclic hydrocarbon group which may be substituted, alkoxy group, —Q or —COOQ, in which R' and R" each independently represents an alkyl group which may have a substituent; and Q represents a tertiary alkyl group having 5 to 20 carbon atoms, alkoxymethyl group, alkoxyethyl group or isobornyl group.

8. The positive-working photoresist composition according to claim 7, wherein the resin (A) further comprises a repeating structural unit represented by the following general formula (III):

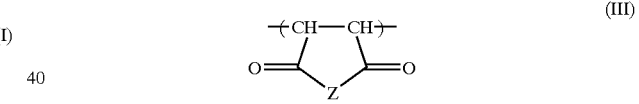
(III)

wherein Z represents an oxygen atom or N—$R^3$ in which $R^3$ represents a hydrogen atom, hydroxyl group, straight-chain or branched alkyl group or —O—$SO_2$—$R^4$ in which $R^4$ represents an alkyl or trihalomethyl group.

9. The positive-working photoresist composition according to claim 7, further comprising at least one of fluorine-based and/or silicon-based surface active agents.

10. The positive-working photoresist composition according to claim 7, further comprising an organic basic compound.

* * * * *